(12) United States Patent
Huang et al.

(10) Patent No.: US 12,727,233 B2
(45) Date of Patent: Sep. 1, 2026

(54) COMPLEMENTARY FET (CFET) DEVICES AND METHODS

(71) Applicant: Taiwan Semiconductor Manufacturing Co., Ltd., Hsinchu (TW)

(72) Inventors: Jui-Chien Huang, Hsinchu (TW); Szuya Liao, Hsinchu (TW); Cheng-Yin Wang, Hsinchu (TW); Shih Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 987 days.

(21) Appl. No.: 17/861,052

(22) Filed: Jul. 8, 2022

(65) Prior Publication Data

US 2023/0178435 A1 Jun. 8, 2023

Related U.S. Application Data

(60) Provisional application No. 63/286,926, filed on Dec. 7, 2021.

(51) Int. Cl.
*H10D 64/01* (2025.01)
*H10D 30/01* (2025.01)
(Continued)

(52) U.S. Cl.
CPC ......... *H10D 84/038* (2025.01); *H10D 30/014* (2025.01); *H10D 30/031* (2025.01);
(Continued)

(58) Field of Classification Search
CPC .. H10D 84/038; H10D 30/014; H10D 30/031; H10D 30/43; H10D 30/6729; H10D 30/6735; H10D 30/6757; H10D 62/121; H10D 62/151; H10D 64/017; H10D 84/0167; H10D 84/017; H10D 84/0186; H10D 84/856; H10D 88/01; H10D 30/0212; H10D 84/0188; H10D 84/85;
(Continued)

(56) References Cited

U.S. PATENT DOCUMENTS

2019/0172751 A1* 6/2019 Smith .................... H10D 88/00
2020/0091312 A1* 3/2020 Ching .................... H10D 30/62
(Continued)

FOREIGN PATENT DOCUMENTS

CN 111696957 A 9/2020
CN 112687626 A * 4/2021
TW 202117925 A 5/2021

*Primary Examiner* — Samuel Park
(74) *Attorney, Agent, or Firm* — Seed IP Law Group

(57) ABSTRACT

A method includes forming a first transistor of a first semiconductor device. The first semiconductor device includes a first channel region and a gate electrode on the first channel region. A second semiconductor device is bonded to the first semiconductor device by a bonding layer disposed between the first and second semiconductor devices. A second transistor of the second semiconductor device is formed that includes a second channel region and a second gate electrode on the second channel region. The bonding layer is disposed between the first gate electrode of the first transistor and the second gate electrode of the second transistor.

20 Claims, 27 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2025.01) |
| ***H10D 84/03*** | (2025.01) |
| ***H10D 84/85*** | (2025.01) |
| ***H10D 88/00*** | (2025.01) |
| ***H10P 14/20*** | (2026.01) |

(52) U.S. Cl.

CPC ......... *H10D 30/43* (2025.01); *H10D 30/6729* (2025.01); *H10D 30/6735* (2025.01); *H10D 30/6757* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/0186* (2025.01); *H10D 84/856* (2025.01); *H10D 88/01* (2025.01); *H10P 14/3411* (2026.01); *H10P 14/3462* (2026.01)

(58) Field of Classification Search

CPC .............. H10D 88/00; H01L 21/02532; H01L 21/02603; B82Y 10/00

See application file for complete search history.

(56) References Cited

U.S. PATENT DOCUMENTS

| | | | | |
|---|---|---|---|---|
| 2020/0135932 | A1* | 4/2020 | Wang | B82Y 10/00 |
| 2020/0294998 | A1* | 9/2020 | Lilak | H01L 23/535 |
| 2021/0028169 | A1 | 1/2021 | Smith et al. | |
| 2021/0104522 | A1* | 4/2021 | Gardner | H10D 62/80 |
| 2022/0199624 | A1* | 6/2022 | Huang | H10B 53/30 |

* cited by examiner 100
120
132
130
102

X
Z
Y
100
120
118
116
130
102
126

X
Z
Y 100
146
144
148
142
140
102

Y
Z
X
100
147
146
144
148
142
140
106
118
102
147

Y
Z
X 100
147
147
106
154
151
102

Y
Z
X
100
147
147
106
151
150
102

Y
Z
X

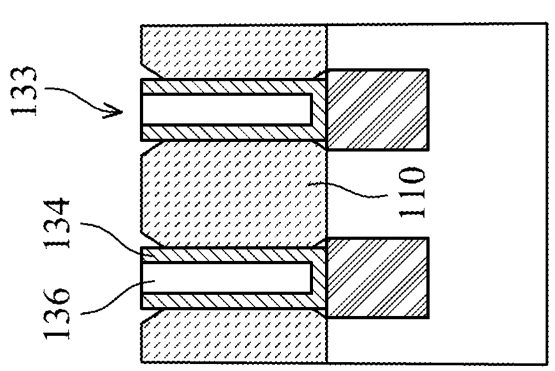
FIG. 2Q
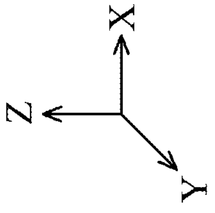
100
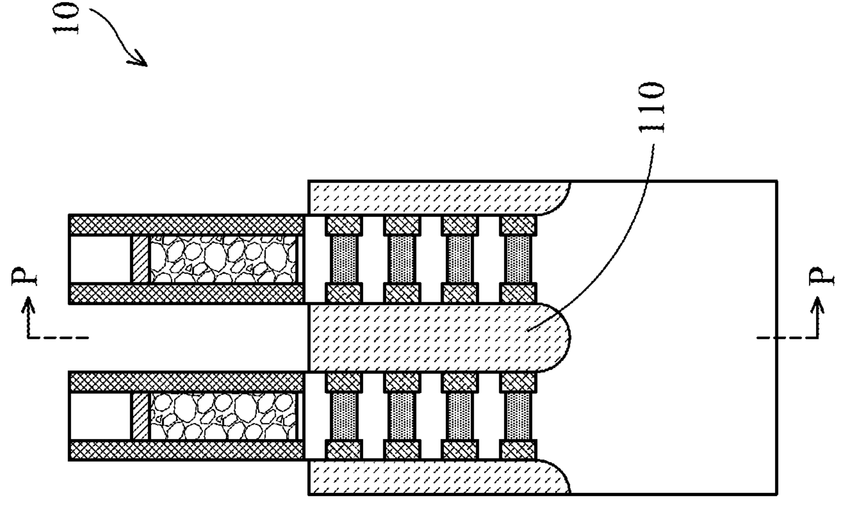
FIG. 2P
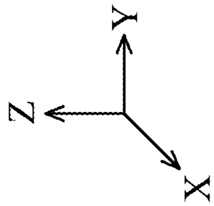

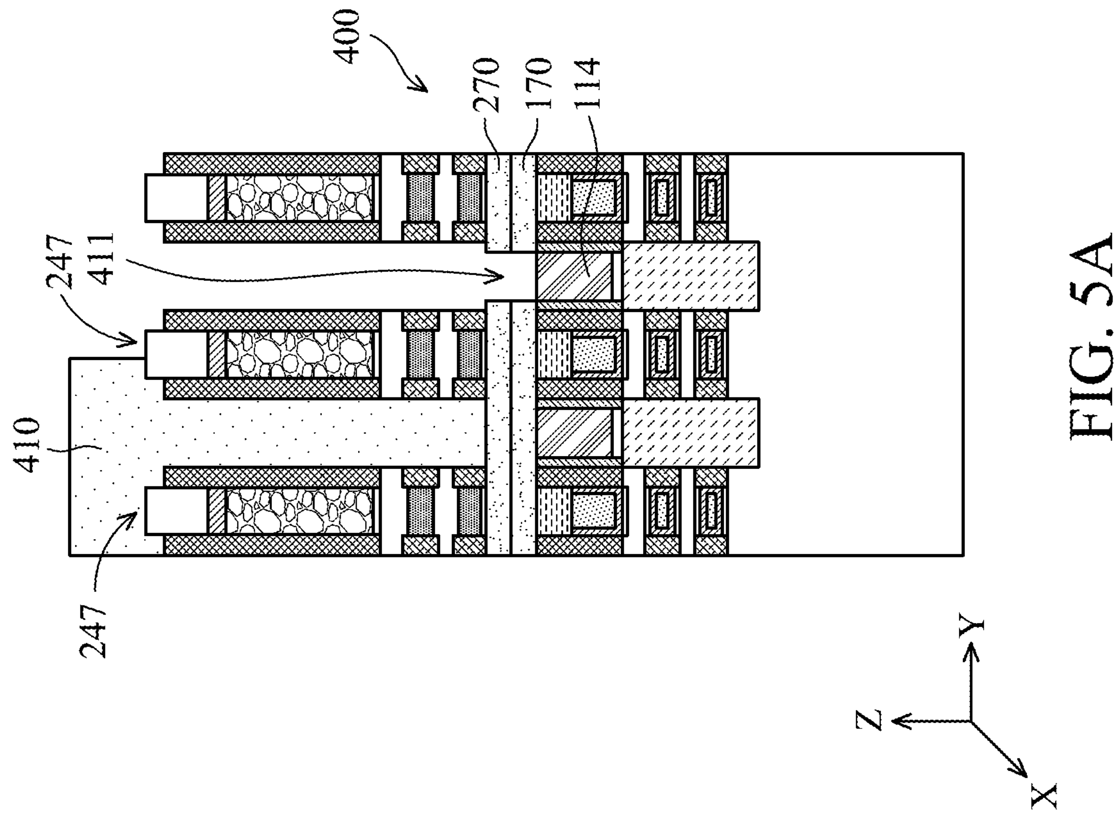
FIG. 5A
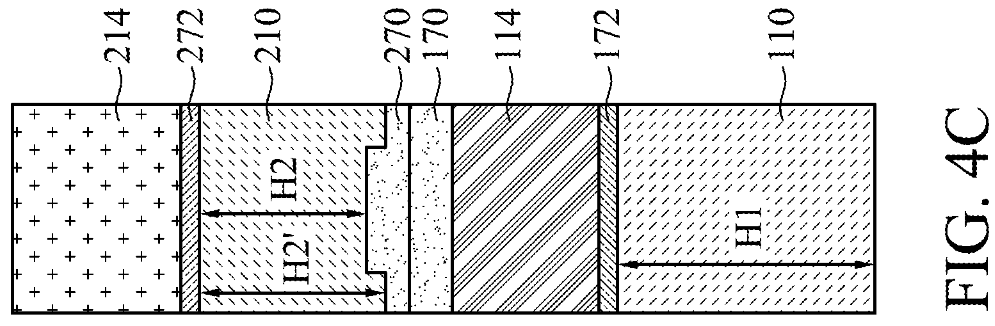
FIG. 4C
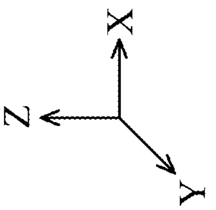

COMPLEMENTARY FET (CFET) DEVICES AND METHODS

BACKGROUND

There has been a continuous demand for increasing computing power in electronic devices including smart phones, tablets, desktop computers, laptop computers and many other kinds of electronic devices. Semiconductor devices provide the computing power for these electronic devices. One way to increase computing power in semiconductor devices is to increase the number of transistors and other semiconductor device features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Source and drain regions may be coupled to the nanostructures. It can be difficult to form source and drain regions with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4C is a cross-sectional view of the semiconductor device taken along the line 4C of FIG. 4A, in accordance with some embodiments.

FIGS. 5A through 5C are cross-sectional views of a semiconductor device at various stages of processing, in accordance with some embodiments.

DETAILED DESCRIPTION

Figures 1, 2A:
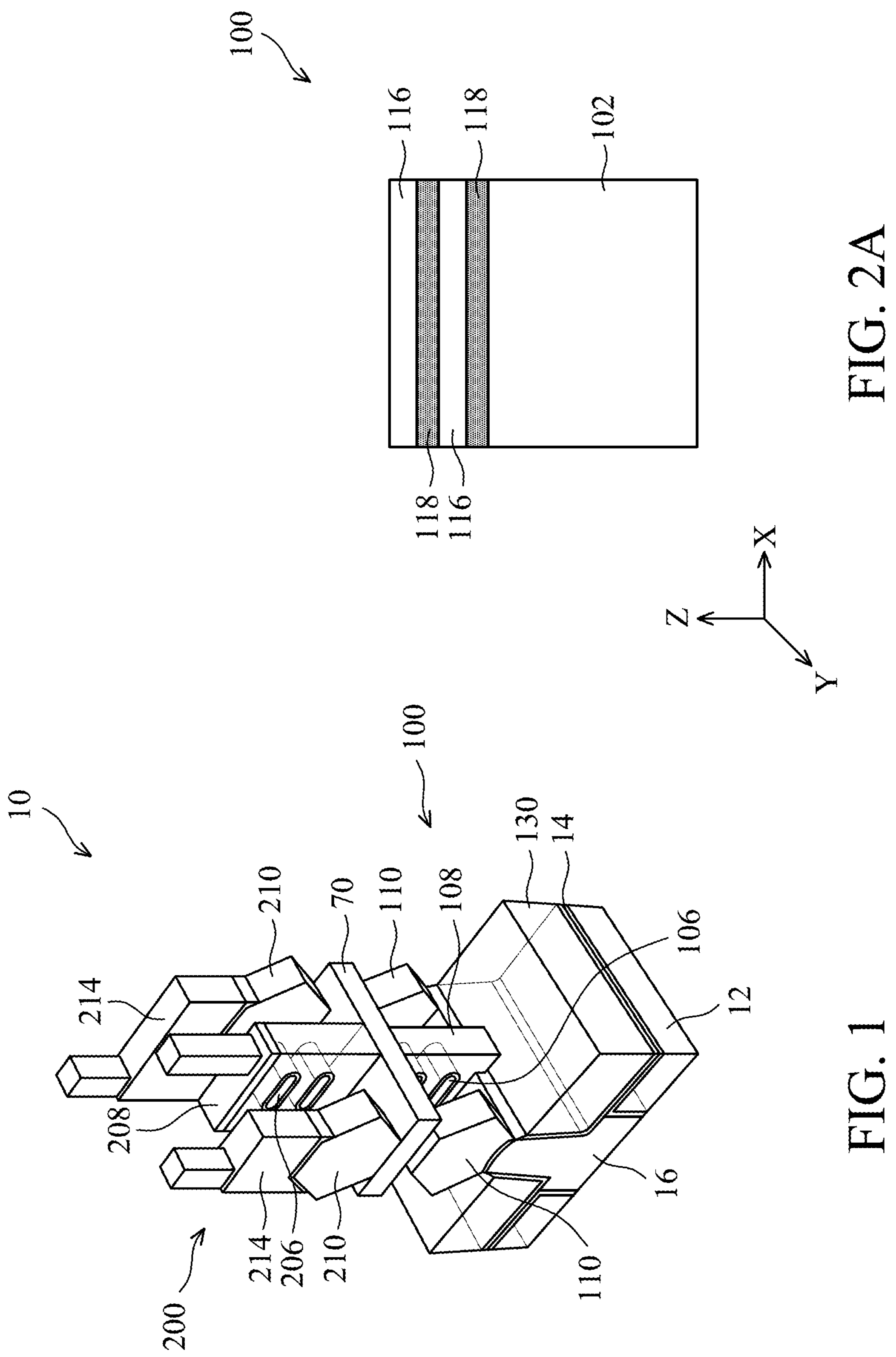
FIG. 1 is a perspective view schematically illustrating a semiconductor device, in accordance with some embodiments.
FIGS. 2A through 3J are cross-sectional views of a semiconductor device at various stages of processing, according to some embodiments.

In the following description, many thicknesses and materials are described for various layers and structures within a semiconductor device. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments", "in an embodiment", or "in one embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a perspective view schematically illustrating a semiconductor device 10, in accordance with some embodiments. The semiconductor device 10 includes a first semiconductor device 100 and a second semiconductor device 200, which are separated from one another by a bonding layer 70.

As shown in FIG. 1, each of the first and second semiconductor devices 100, 200 may be or include a transistor. The transistor may be any type of transistor having any type of transistor architecture, for example, nanosheet or gate-all-around transistors, FinFET transistors, 2D structure, or any other type of transistor structure may be included. In the example illustrated in FIG. 1, each of the first and second semiconductor devices 100, 200 includes at least one gate-all-around transistor. For example, the first semiconductor device 100 includes a transistor having a channel region formed of a stack of semiconductor nanostructures 106, a gate electrode 108, and source/drain regions 110. Similarly, the second semiconductor device 200 includes a transistor having a channel region formed of a stack of semiconductor nanostructures 206, a gate electrode 208, and source/drain regions 210.

As set forth in more detail below, the semiconductor device 10 may be formed by forming the first semiconductor device 100 on a substrate, then bonding the first semiconductor device 100 to the second semiconductor device 200 using the bonding layer 70. The bonding layer 70 thus may physically separate and electrically isolate electrical features of each of the first and second semiconductor devices 100, 200. After bonding, the second semiconductor device 200 may be further processed to form or define electrical features, such as the transistors of the second semiconductor device 200.

In some embodiments, electrical contacts 16 may be formed at the backside of the first semiconductor device 100. The electrical contacts 16 may be, for example, source/drain contacts that electrically couple to or are in contact with source/drain regions 110. In some embodiments, the electrical contacts 16 on the backside of the first semiconductor device 100 may be a backside power rail that may be electrically coupled with one or more of the source/drain regions 110 or gate electrode 108 of the first semiconductor device 100.

As shown in FIG. 1, source/drain contacts 214 are formed on the source/drain regions 210, and in some embodiments, the source/drain contacts 214 contact a silicide layer on the source/drain regions 210. The semiconductor nanostructures 106, 206 act as channel regions of the transistors of the first and second semiconductor devices 100, 200, and the transistors can be operated by applying voltages to the gate electrodes 108, 208, the source/drain contacts 214, and the electrical contacts 16 in order to enable or prevent current flowing through the semiconductor nanostructures 106, 206 between the source/drain regions 110, 210.

The semiconductor nanostructures 106, 206 each extend between the neighboring source/drain regions 110, 210. The semiconductor nanostructures 106, 206 can include a monocrystalline semiconductor material such as silicon, silicon germanium, or other semiconductor materials. The semiconductor nanostructures 106, 206 may be an intrinsic semiconductor material or may be a doped semiconductor material. The semiconductor nanostructures may include nanosheets, nanowires, or other types of nanostructures.

The gate electrodes 108, 208 include one or more conductive materials. The gate electrodes 108, 208 can include one or more of tungsten, aluminum, titanium, tantalum, copper, gold, or other conductive materials. In some embodiments, the gate electrodes 108, 208 respectively surround (e.g., surrounds at least four sides) the nanostructures 106, 206 such that each semiconductor nanostructure 106, 206 extends through the respective gate electrode 108, 208 between the source/drain regions 110, 210. A gate dielectric surrounds the nanostructures 106, 206 and acts as a dielectric sheath between the nanostructures 106, 206 and the gate electrodes 108, 208. Accordingly, the transistors of the first and second semiconductor devices 100, 200 may be considered a gate all around nanostructure transistor. While examples illustrated herein primarily utilized gate all around transistors, other types of transistors can be utilized without departing from the scope of the present disclosure.

In some embodiments, the semiconductor device 10 includes a substrate 12 and shallow trench isolation regions 130 on or extending into the substrate 12. The substrate 12 may be any suitable substrate, and in some embodiments, is a semiconductor substrate.

As will be described in further detail herein, embodiments of the present disclosure provide semiconductor devices and methods in which first and second semiconductor devices (e.g., transistors) of a semiconductor device, such as of the semiconductor device 10, may be stacked on one another and may have different device architecture or transistor structure from one another, such as nanosheet or gate-all-around transistors, FinFET transistors, 2D structure, or any other type of transistor structure. In some embodiments, the first and second semiconductor devices have different conductivity types, different semiconductor materials, or different crystal lattice orientations. In some embodiments, source/drain contacts and gate electrodes are provided in two or more layers that are separated from one another by a bonding layer, which facilitates implementation of the semiconductor device as a sequential CFET device, as the electrical features of a first semiconductor device may be isolated from those of a second semiconductor device.

CFET devices may be advantageously formed with increased density as compared with other types of transistor devices as the CFET devices may be stacked on top of one another. Moreover, the semiconductor devices provided herein, including the semiconductor device 10 shown in FIG. 1, may be sequential CFET devices which are formed in a less complex manner than monolithic CFET devices, since the first semiconductor device 100 may be formed and then bonded to the second semiconductor device 200, which may then be further processed.

The semiconductor devices and methods provided herein advantageously facilitate formation of CFET devices having first and second semiconductor devices which may be channel and strain independent with respect to one another, as the first and second semiconductor devices are isolated from one another by the bonding layer. Similarly, the channel direction and channel material can be different between the first and second semiconductor devices of a stacked semiconductor device, and the source/drain regions may also be formed of different materials in the first and second semiconductor devices.

In view of the above and as will be described in further detail herein, the semiconductor devices provided herein facilitate improved device performance tuning, for example, as the transistors of the first and second semiconductor devices may be formed differently and independent of one another. For example, the transistors of the first and second semiconductor devices may be formed with different threshold voltage Vt tuning, for example, with different work function metal thicknesses.

In some embodiments, the bonding layer between the first and second semiconductor devices may be advantageously utilized as an etch stop layer during processing of the second semiconductor device subsequent to bonding the first and second semiconductor devices to one another using the bonding layer. This avoids additional complexity and costs of processing steps that would otherwise be implemented in order to form an etch stop layer.

FIGS. 2A through 3J are cross-sectional views of a semiconductor device 300 at various stages of processing, according to some embodiments. The semiconductor device 300 may be a Complementary FET (CFET) device that includes a first semiconductor device 100 and a second semiconductor device 200 which may be different from one another. The semiconductor device 10 schematically illustrated in FIG. 1 may be formed utilizing one or more of the processes set forth in greater detail herein with respect to the semiconductor device 300.

Figures 2B, 2C:
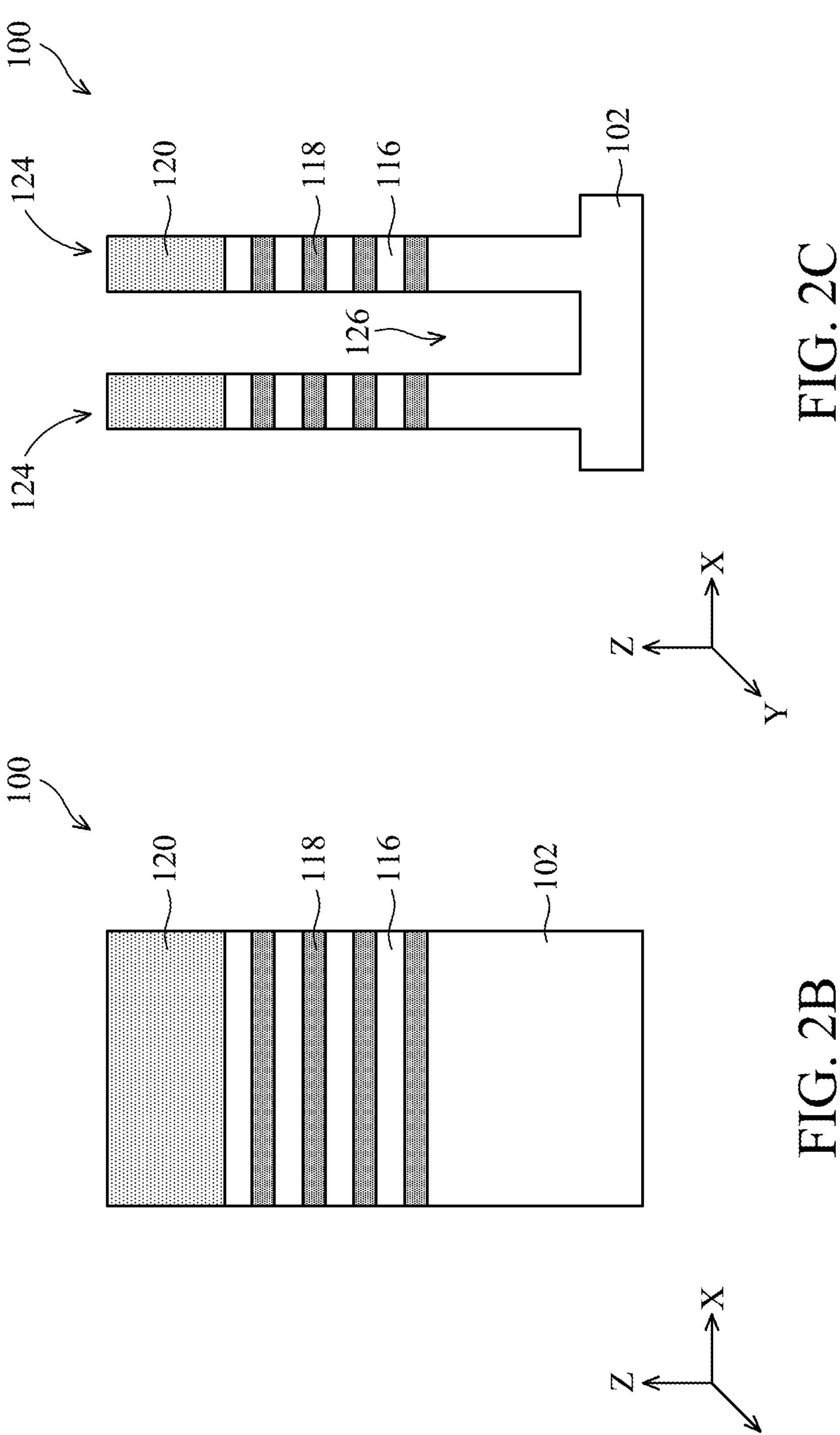
Figures 2D, 2E:
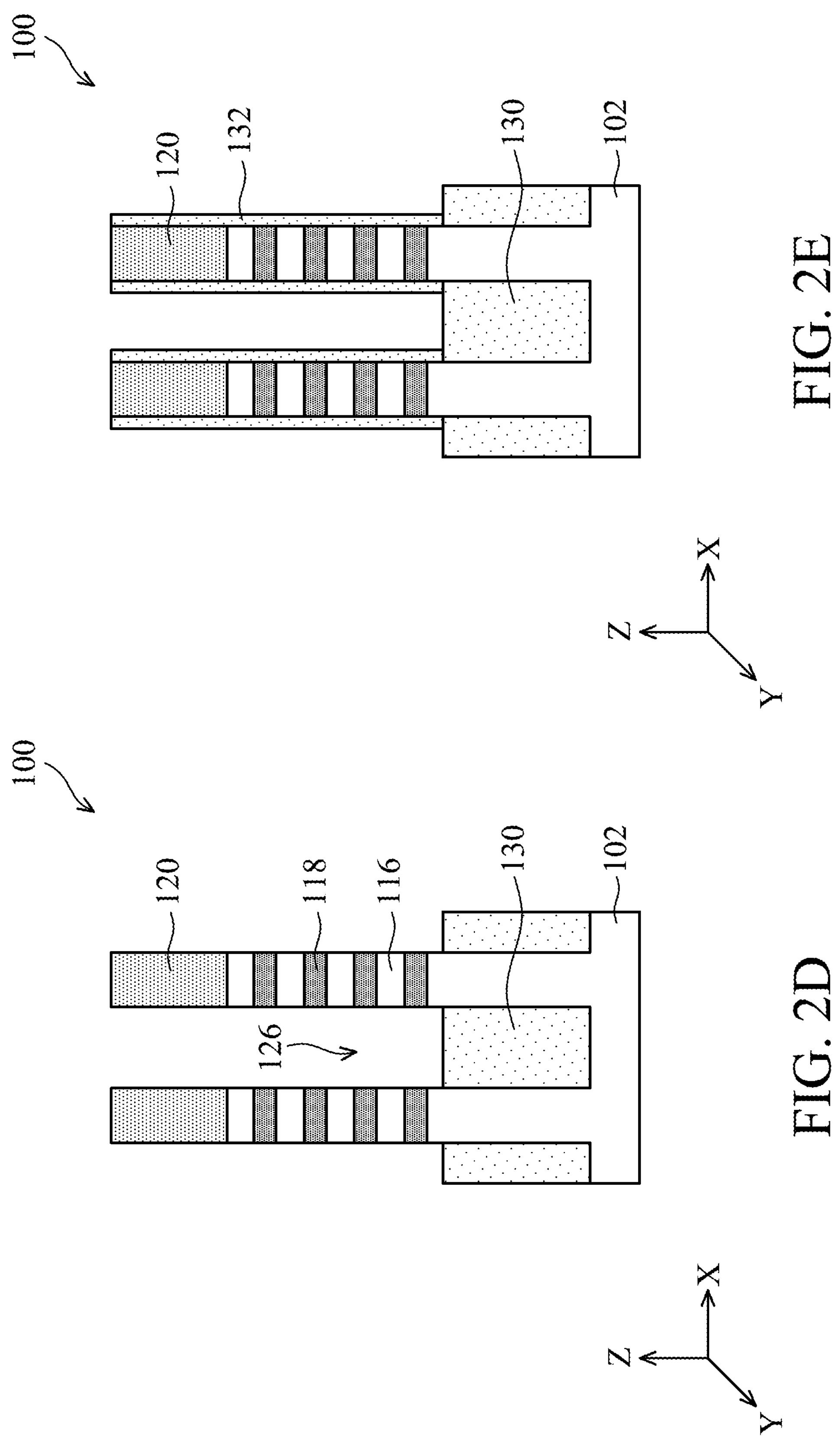
Figures 2F, 2G:
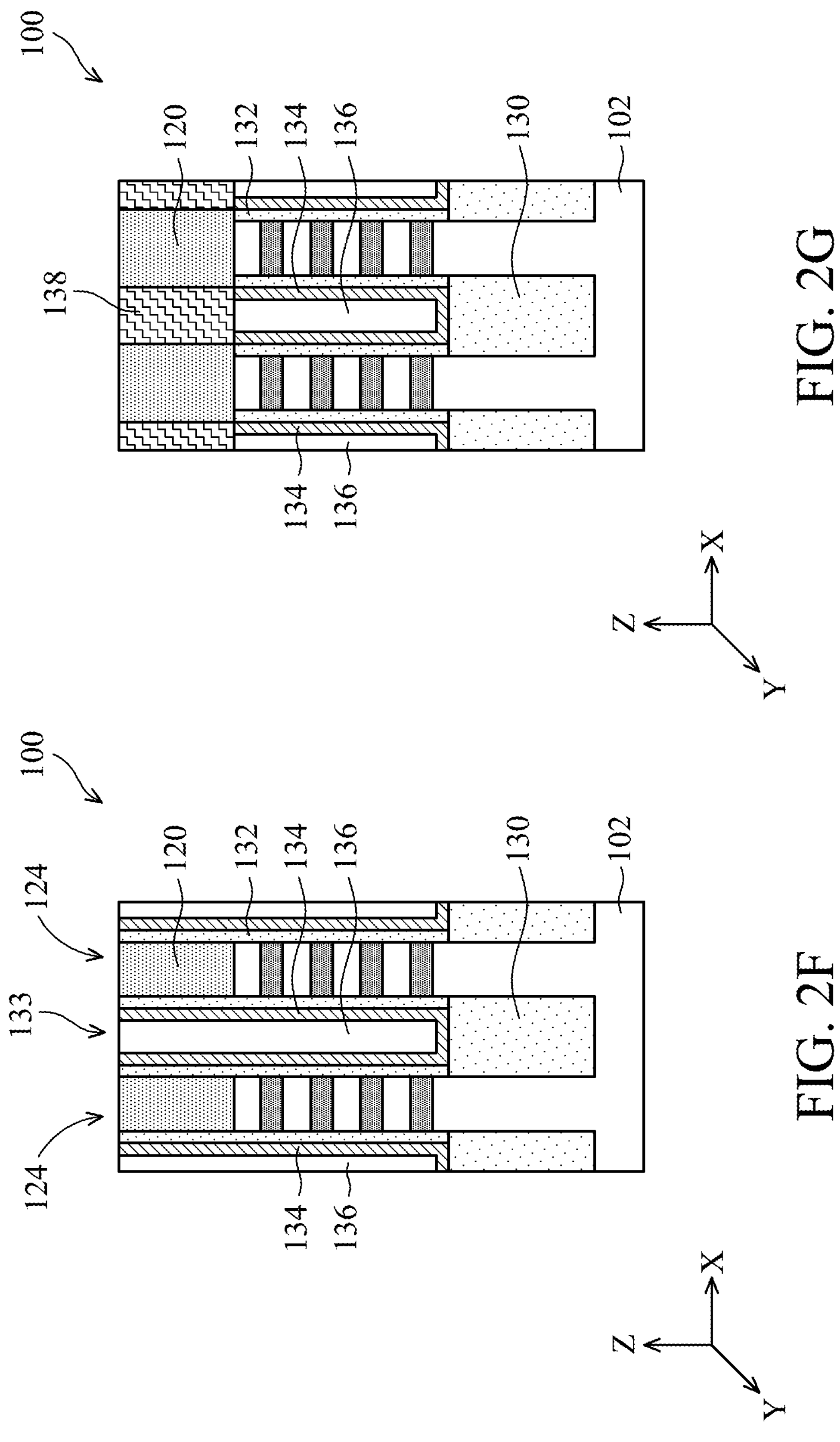
Figures 2H, 2I:
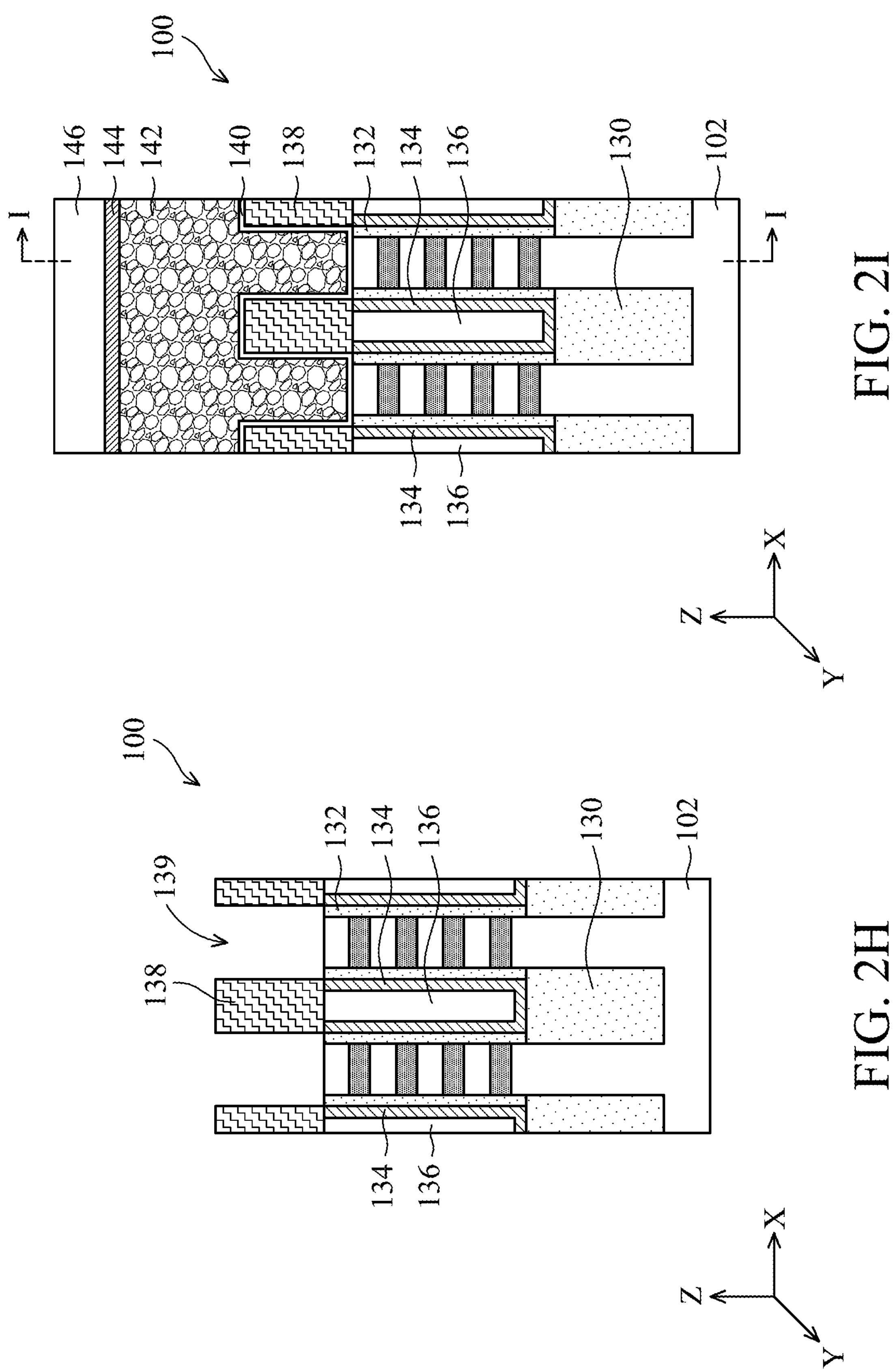
Figures 2J, 2K:
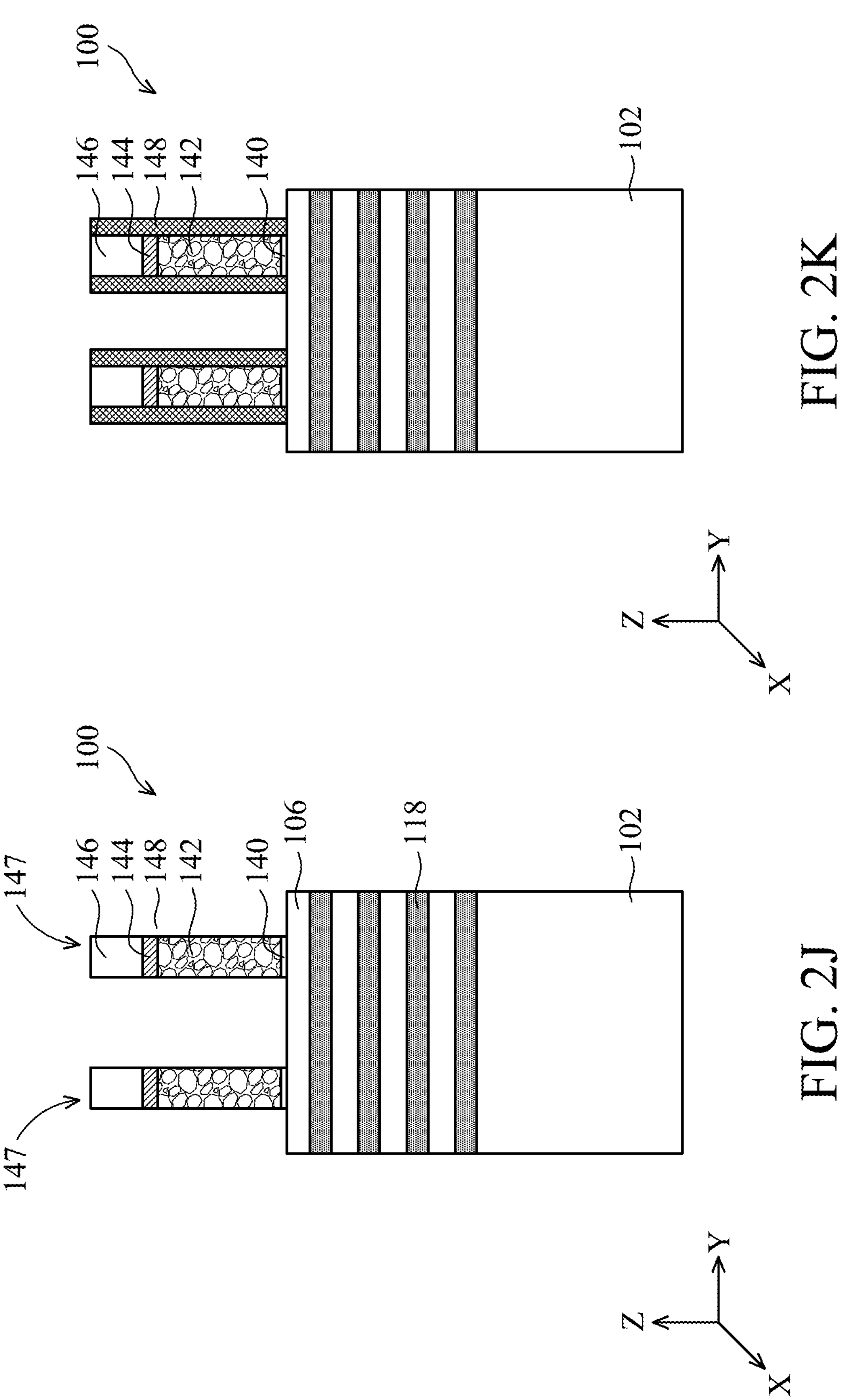
Figures 2L, 2M:
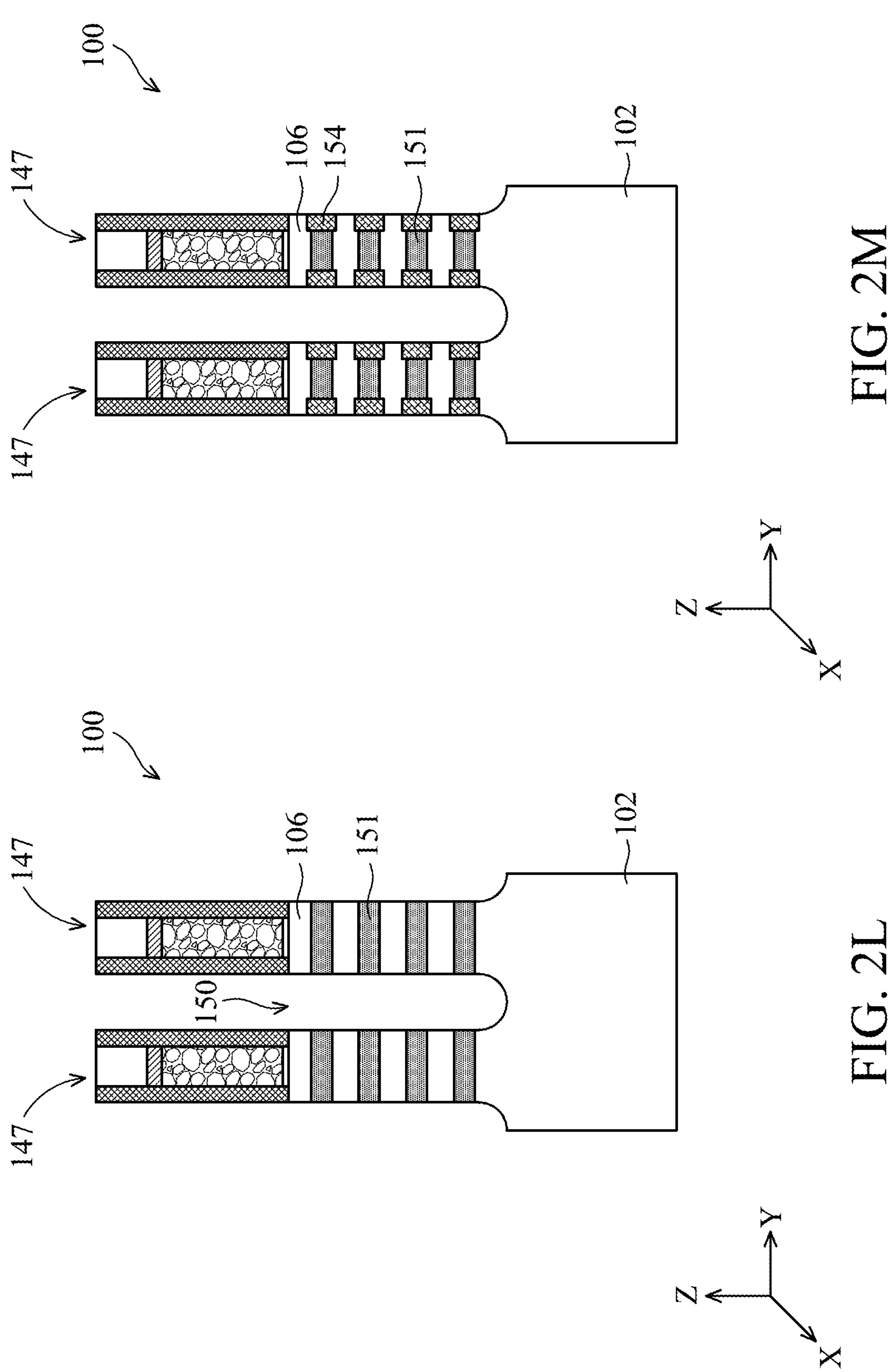
Figures 2N, 2O:
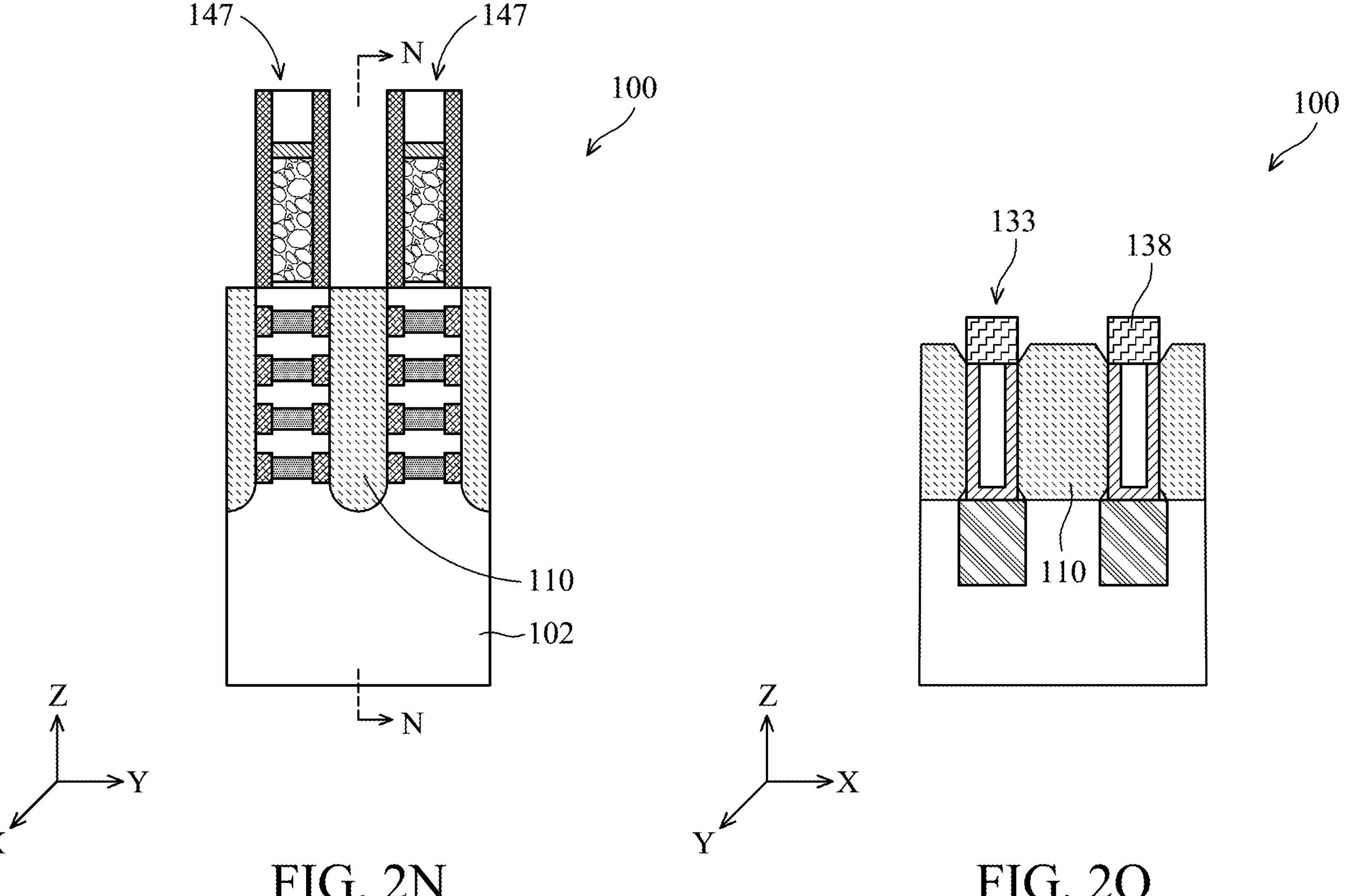
Figures 2R, 2S:
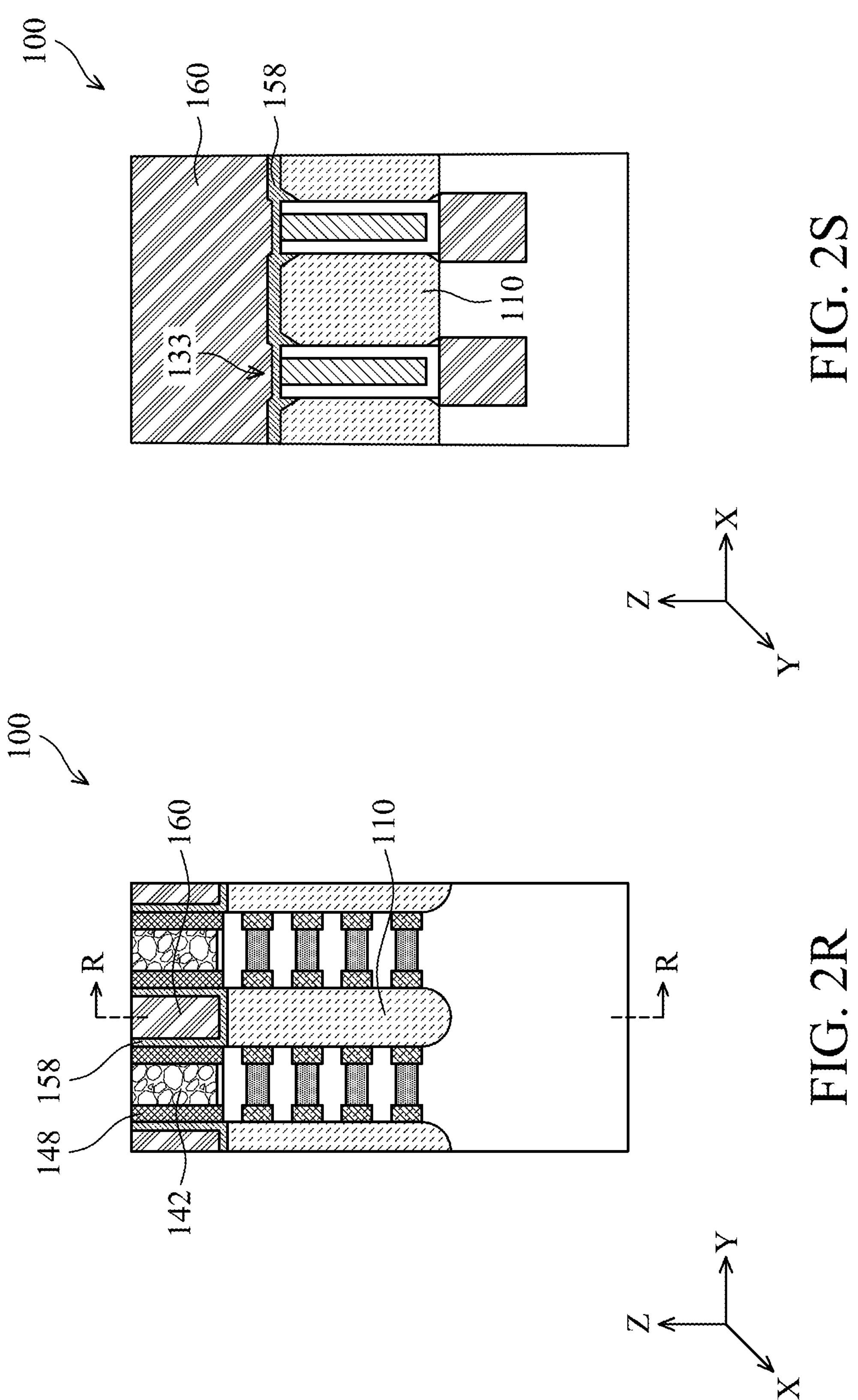
Figures 2T, 2U:
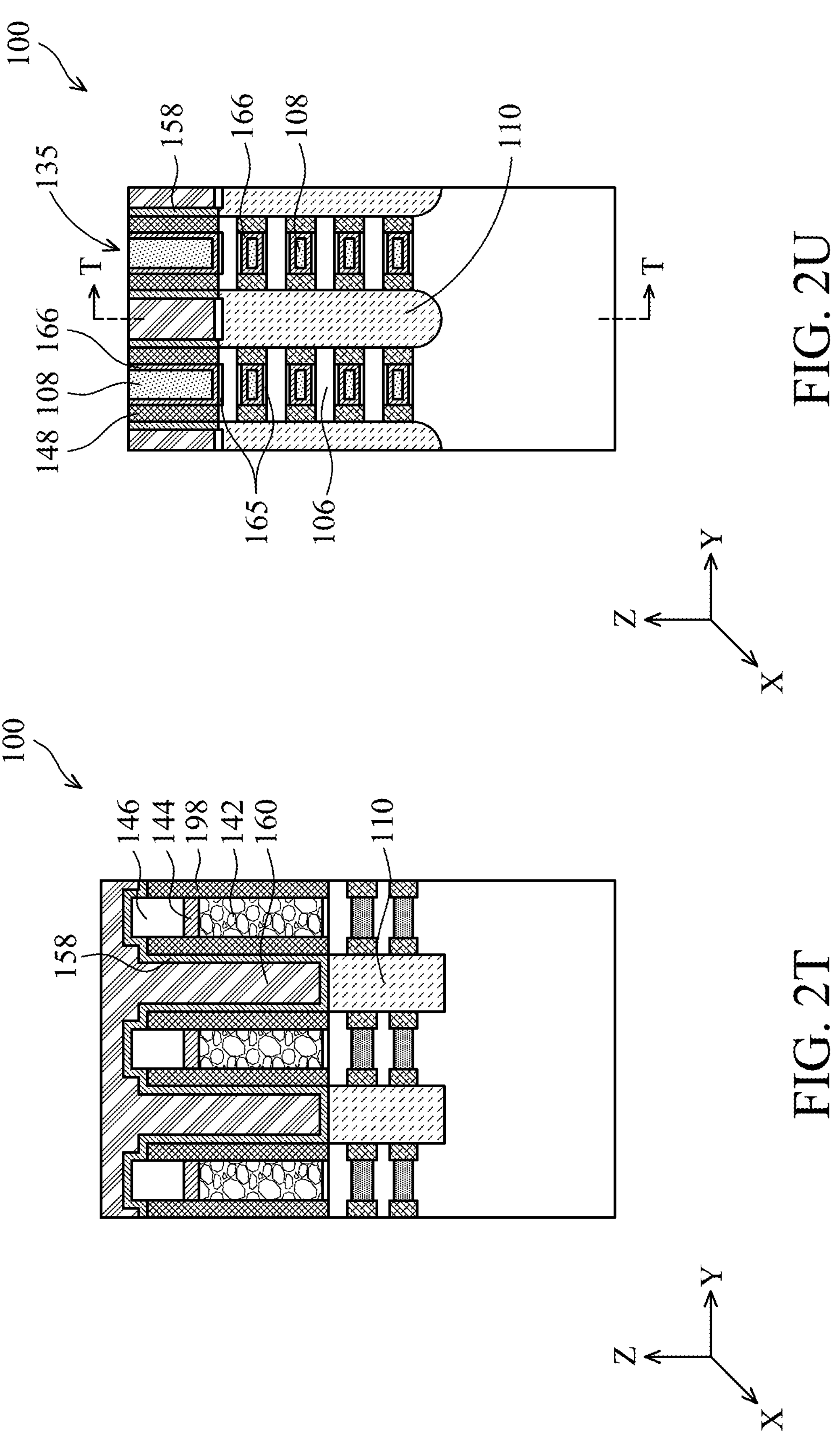
Figure 2W:
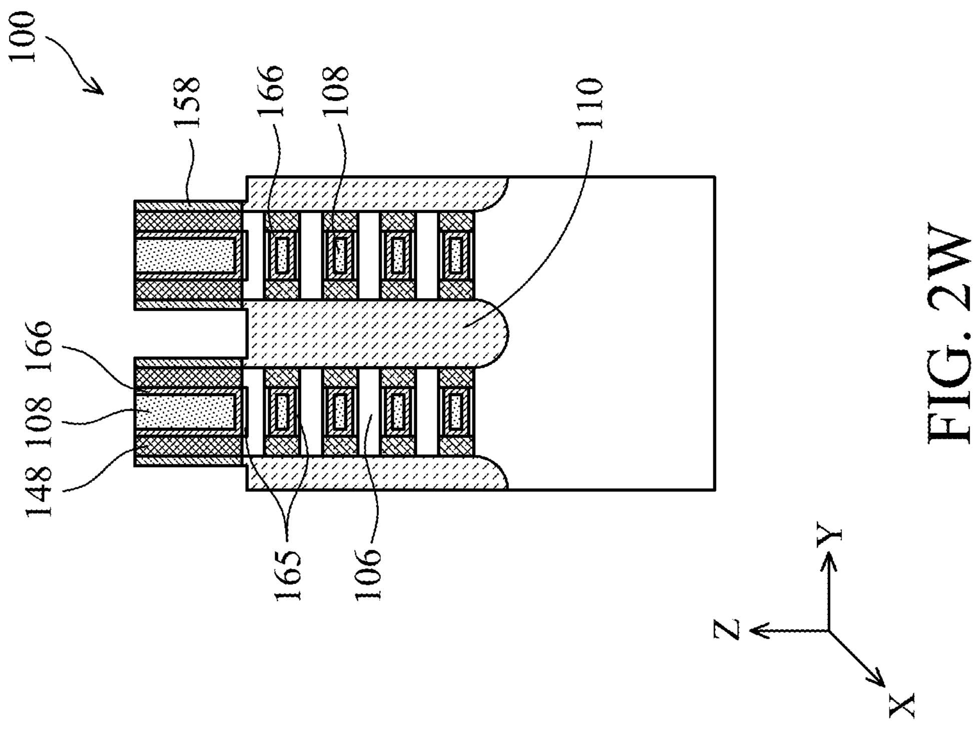
Figure 2V:
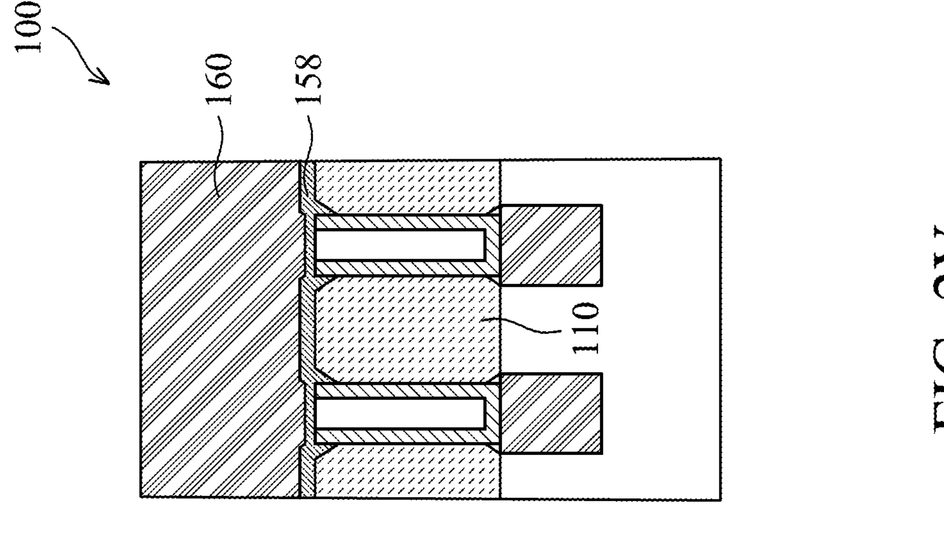
Figure 2V:
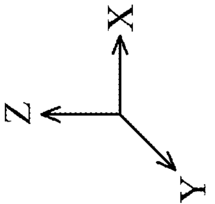
Figures 2X, 2Y:
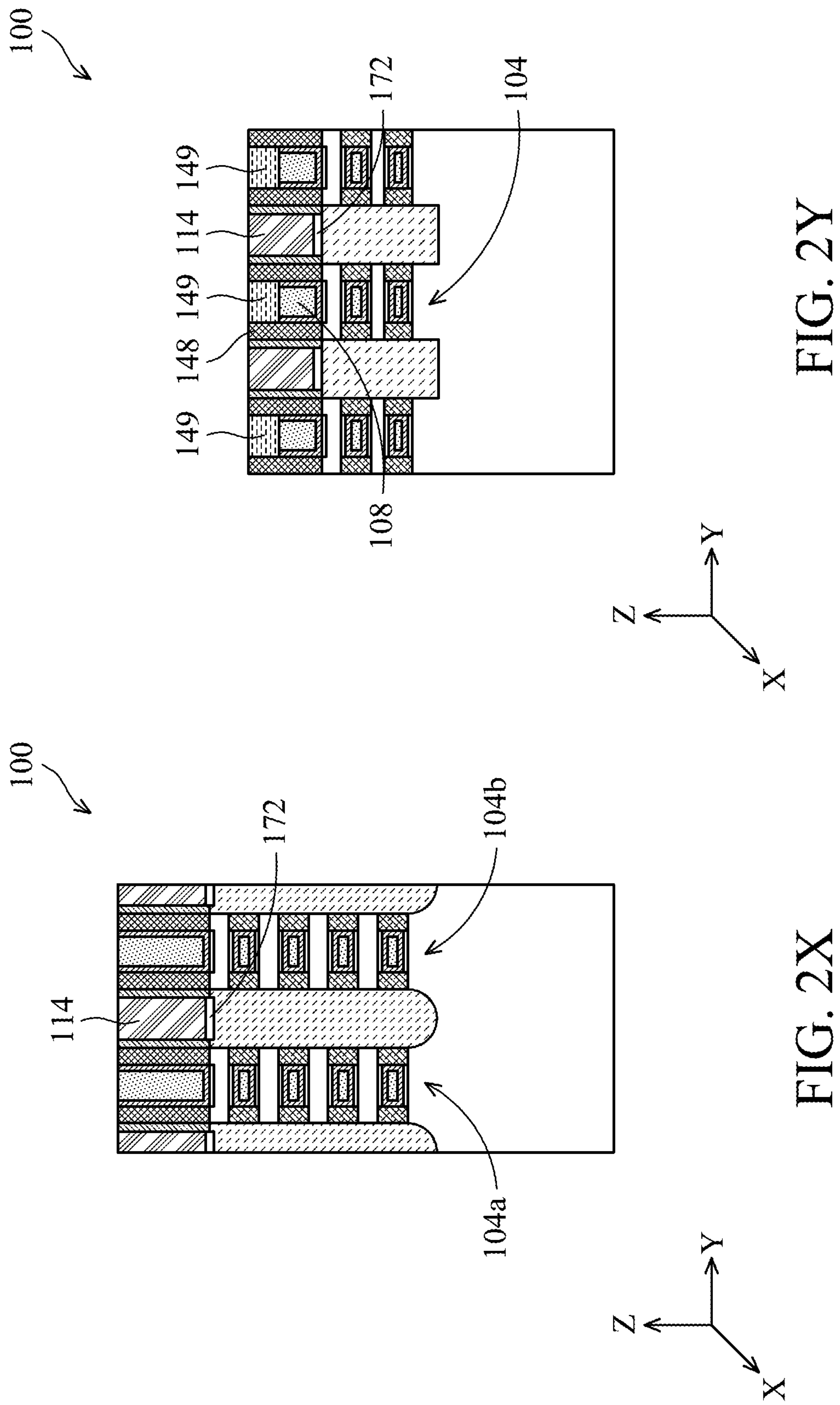

FIGS. 2A through 2Y illustrate an exemplary process for forming the first semiconductor device 100 that includes nanostructure transistors, and FIGS. 3A through 3J generally illustrate formation of the second semiconductor device 200 that includes nanostructure transistors. FIGS. 2A through 3J illustrate how the transistors of the semiconductor device 300 can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

The Figures of the present disclosure may include axes that indicate the orientation of the cross-sectional view of that figure. The axes include lateral axes X and Y, and vertical axis Z. All axes are mutually orthogonal with each other. Figures in which the X-axis extends from right to left will be referred to as "X-Views." Figures in which the Y-axis goes from right to left will be referred to as "Y-Views."

As shown in FIG. 2A, the semiconductor device 100 includes a semiconductor substrate 102. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants may be, for example, boron ($BF_2$) for an n-type transistor and phosphorus for a p-type transistor.

The semiconductor device 100 includes a plurality of semiconductor layers 116, which may form the semiconductor nanostructures 106. The semiconductor nanostructures 106 are layers of semiconductor material. The semiconductor layers 116 are formed over the substrate 102. The semiconductor layers 116 may include one or more layers of Si, Ge, SiGe, GaAs, InSb, GaP, GaSb, InAlAs, InGaAs, GaSbP, GaAsSb or InP. In some embodiments, the semiconductor layers 116 are formed of the same semiconductor material as the substrate 102. Other semiconductor materials can be utilized for the semiconductor layers 116 without departing from the scope of the present disclosure. In a primary non-limiting example described herein, the semiconductor layers 116 and the substrate 102 are silicon.

Sacrificial semiconductor layers 118 are disposed between the semiconductor layers 116. The sacrificial semiconductor layers 118 include a different semiconductor material than the semiconductor layers 116. In an example in which the semiconductor layers 116 include silicon, the sacrificial semiconductor layers 118 may include SiGe. In one example, the silicon germanium sacrificial semiconductor layers 118 may include between 20% and 30% germanium, though other concentrations of germanium can be utilized without departing from the scope of the present disclosure. The concentration of germanium in the silicon germanium sacrificial semiconductor layers 118 is selected to be different than the concentration of germanium in a subsequently formed SiGe sacrificial cladding. The compositions of the sacrificial semiconductor layers 118 and the sacrificial cladding are selected to result in different etching characteristics. The purpose and benefits of this will be described in further detail below.

In some embodiments, the semiconductor layers 116 and the sacrificial semiconductor layers 118 are sequentially and alternately formed, for example, by alternating epitaxial growth processes on the semiconductor substrate 102. For example, a first epitaxial growth process may result in the formation of the lowest sacrificial semiconductor layer 118 on the top surface of the substrate 102. A second epitaxial growth process may result in the formation of the lowest semiconductor layer 116 on the top surface of the lowest sacrificial semiconductor layer 118. A third epitaxial growth process results in the formation of the second lowest sacrificial semiconductor layer 118 on top of the lowest semiconductor layer 116. Alternating epitaxial growth processes may be performed until a selected number of semiconductor layers 116 and sacrificial semiconductor layers 118 have been formed.

As shown in FIG. 2B, in some embodiments, a layer 120 is formed on top of the uppermost semiconductor layer 116. In some embodiments, the layer 120 can be a same semiconductor material as the sacrificial semiconductor layers 118. Alternatively, the layer 120 can include a dielectric material or other types of materials. In some embodiments, the layer 120 is not formed.

In the example semiconductor device 100 illustrated in FIG. 2B, four semiconductor layers 116 are included. However, in various embodiments, the semiconductor device 100 may include more or fewer semiconductor layers 116. In some embodiments, the semiconductor device 100 may include only a single semiconductor layer 116 that is spaced apart from the substrate 102 by a single sacrificial semiconductor layer 118.

In some embodiments, the vertical thickness of the semiconductor layers 116 may be between 2 nm and 15 nm. In some embodiments, the thickness of the sacrificial semiconductor layers 118 may be between 5 nm and 15 nm. Other thicknesses and materials can be utilized for the semiconductor layers 116 and the sacrificial semiconductor layers 118 without departing from the scope of the present disclosure.

In some embodiments, the sacrificial semiconductor layers 118 correspond to a first sacrificial epitaxial semiconductor region having a first semiconductor composition. In subsequent steps, the sacrificial semiconductor layers 118 will be removed and replaced with other materials and structures. For this reason, the layers 118 are described as sacrificial. As will be described further below, the semiconductor layers 116 will be patterned to form the semiconductor nanostructures 106 of transistors.

As shown in FIG. 2C, trenches 126 are formed and extend through the sacrificial semiconductor layers 118, the semiconductor layers 116, and at least partially into the substrate 102. The trenches 126 define fin structures 124, each of which includes a respective stack of semiconductor layers 116 and sacrificial semiconductor layers 118. While FIG. 2C illustrates formation of two fin structures 124, it will be readily appreciated that in various embodiments, more or fewer than two fin structures may be formed in the semiconductor device 100.

The trenches 126 may be formed utilizing any suitable technique. In some embodiments, the trenches 126 may be formed by depositing a hard mask layer on the layer 120. In some embodiments, the layer 120 may itself be a hard mask layer, and in other embodiments a hard mask layer may be formed over the layer 120 and may be patterned and etched using standard photolithography processes. After the hard mask layer has been patterned and etched, portions of the sacrificial semiconductor layers 118, the semiconductor layers 116, and the substrate 102 that are not covered by the hard mask layer are selectively removed, for example, by an etching process. The etching process results in formation of the trenches 126. The etching process can include a single etching step. Alternatively, the etching process can include multiple etching steps. For example, a first etching step can etch the top sacrificial semiconductor layer 118. A second etching step can etch the top semiconductor layer 116. These alternating etching steps may be repeated until all of the sacrificial semiconductor layers 118 and semiconductor layers 116 are etched at the exposed regions. A final etching step may etch at least partially into the substrate 102.

As shown in FIG. 2D, shallow trench isolation regions 130 may be formed in the trenches 126. In some embodiments, an upper surface of the shallow trench isolation regions 130 is disposed below a level of the lowest sacrificial semiconductor layer 118 or below a level of an upper surface of the substrate 102. The shallow trench isolation regions 130 may be formed of any suitable technique. For example, in some embodiments, the shallow trench isolation regions 130 are formed by depositing a dielectric material in the trenches 126 and by recessing the deposited dielectric material so that a top surface of the dielectric material is lower than the lowest sacrificial semiconductor layer 118.

The shallow trench isolation regions 130 can be utilized to separate individual transistors or groups of transistors formed in conjunction with the semiconductor substrate 102. The dielectric material for the shallow trench isolation regions 130 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 130 without departing from the scope of the present disclosure.

FIGS. 2E through 2H illustrate a process of forming a hybrid fin, which may be included in some embodiments. However, in other embodiments, the hybrid fins may be omitted. As such, one or more of the processes illustrated in FIGS. 2E through 2H may be omitted in some embodiments. As shown in FIG. 2E, a cladding layer 132 may be formed on side surfaces of the fin structures 124. For example, the cladding layer 132 may be deposited on the sides of the semiconductor layers 116 and the sacrificial semiconductor layers 118 and on the layer 120. In some embodiments, the cladding layer 132 can be formed by an epitaxial growth from one or more of the semiconductor layers 116, the sacrificial semiconductor layers 118, and the layer 120. Alternatively, the cladding layer 132 can be deposited by a chemical vapor deposition (CVD) process. Other processes can be utilized for depositing the cladding layer 132 without departing from the scope of the present disclosure.

In some embodiments, the cladding layer 132 includes SiGe. In particular, the cladding layer 132 may include SiGe with a different concentration of germanium than the sacrificial semiconductor layers 118. The cladding layer 132 can include other concentrations, materials, or compositions without departing from the scope of the present disclosure.

As shown in FIG. 2F, hybrid fin structures 133 may be formed in the gaps between the cladding layers 132. The hybrid fin structures 133 may include a first dielectric layer 134 and a second dielectric layer 136.

In some embodiments, the first dielectric layer 134 is formed of a dielectric material, which may be a low-K dielectric material. In some embodiments, the first dielectric layer 134 may include silicon nitride. In some embodiments, the first dielectric layer 134 is formed of a dielectric material, which may include silicon oxide. The first dielectric layer 134 can be deposited on the shallow trench isolation regions 130 and on side surfaces of the cladding layers 132.

The second dielectric layer 136 can be deposited on the first dielectric layer 134 in the trenches filling the remaining space between the fins 124. The first dielectric layer 134 and the second dielectric layer 136 can be deposited by any suitable technique, including CVD, atomic layer deposition (ALD), or by other suitable deposition processes. After deposition of the first and second dielectric layers 134 and 136, the hybrid fin structures 133 may be planarized by a chemical mechanical planarization (CMP) process. Other materials and deposition processes can be utilized to form the hybrid fin structures 133 without departing from the scope of the present disclosure.

As shown in FIG. 2G, the hybrid fin structures 133 are recessed. For example, an etching process may be performed to recess the top surface of the hybrid fin structures 133. In some embodiments, a timed etch may be performed to reduce the top surface of the hybrid fin structures 133 to a level that is substantially equal to or lower than the bottom of the layer 120. The etching process can include a wet etch, dry etch, or any suitable etch for recessing the hybrid fin structures 133 to a selected depth.

In FIG. 2G, a high-K dielectric layer 138 has been deposited on the hybrid fin structures 133. The high-K dielectric layer 138 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 138 may be formed by CVD, ALD, or any suitable method. A planarization process, such as a CMP process, may be performed to planarize the top surface of the high-K dielectric layer 138. The high-K dielectric layer 138 may be termed a helmet layer for the hybrid fin structures 133. Other processes and materials can be utilized for the high-K dielectric layer 138 without departing from the scope of the present disclosure.

As shown in FIG. 2H, portions of the layer 120 and the cladding layer 132 are selectively removed. For example, in some embodiments, an etching process may be performed to remove the layer 120 and to recess the cladding layer 132. The etching process can be performed in one or more steps. The one or more steps selectively etch the layer 120 and the materials of the cladding layer 132 with respect to the material of the high-K dielectric layer 138. Accordingly, in FIG. 2H, the high-K dielectric layer 138 remains protruding above substantially unchanged while other layers have been recessed or removed. The one or more etching steps can include wet etches, dry etches, timed etches, or other types of etching processes.

As shown in FIG. 2I, a thin dielectric layer 140 has been deposited on the top surface of the cladding layer 132, the top semiconductor layer 116, and on the high-K dielectric layer 138. In some embodiments, the thin dielectric layer 140 may have a thickness between 1 nm and 5 nm. The thin dielectric layer 140 may be formed of any dielectric material, and in some embodiments, the thin dielectric layer 140 may include silicon oxide. Other materials, deposition processes, and thicknesses can be utilized for the thin dielectric layer 140 without departing from the scope of the present disclosure.

In FIG. 2I, a polysilicon layer 142 has been deposited on the dielectric layer 140. The polysilicon layer 142 may have a thickness between 20 nm and 100 nm. The polysilicon layer 142 may be formed by any suitable technique, including by an epitaxial growth, a CVD process, a physical vapor deposition (PVD) process, or an ALD process. Other thicknesses and deposition processes can be used for depositing the polysilicon layer 142 without departing from the scope of the present disclosure.

In FIG. 2I, a dielectric layer 144 has been formed, e.g., by deposition, on the polysilicon layer 142. A dielectric layer 146 has been formed on the dielectric layer 144. In one example, the dielectric layer 144 includes silicon nitride. In one example, the dielectric layer 146 includes silicon oxide. The dielectric layers 144 and 146 can be deposited by CVD in some embodiments, although any suitable technique for forming the dielectric layers 144, 146 may be utilized in various embodiments. The dielectric layer 144 can have a thickness between 5 nm and 15 nm in some embodiments. The dielectric layer 146 can have a thickness between 15 nm and 50 nm in some embodiments. Other thicknesses, materials, and deposition processes can be utilized for the dielectric layers 144 and 146 without departing from the scope of the present disclosure.

The dielectric layers 144 and 146 may be patterned and etched to form a mask for the polysilicon layer 142. The dielectric layers 144 and 146 can be patterned and etched using standard photolithography processes. After the dielectric layers 144 and 146 have been patterned and etched to form the mask, the polysilicon layer 142 is etched so that only the polysilicon directly below the dielectric layers 144 and 146 remains. The resulting structure is a polysilicon fin.

FIG. 2J is a cross-sectional view of the semiconductor device 100 taken along cut line I shown in FIG. 2I. In FIGS. 2A through 2I, the X-axis is the lateral axis going left to right on the drawing sheet, while the Y-axis goes in and out of the sheet. In FIGS. 2J through 2N, the Y-axis is the lateral axis going left to right on the sheet, while the X-axis goes in and out of the sheet.

As shown in FIG. 2J, the layers 146, 144, 142, and 140 have been patterned and etched to form dummy gate structures 147. Formation of the dummy gate structures 147 can be accomplished using standard photolithography processes including forming a photoresist mask in the desired pattern of the dummy gate structures 147 and then performing an etching process in the presence of the mask. The photolithography process can also include formation of a hard mask.

As shown in FIG. 2K, a gate spacer layer 148 has been deposited on the top surfaces of the top semiconductor layer 116, as well as on the sides of thin dielectric layer 140, the polysilicon layer 142, and the dielectric layers 144 and 146. In one example, the gate spacer layer 148 includes SiCON. The gate spacer layer 148 can be deposited by CVD, PVD, or ALD. Other materials and deposition processes can be utilized for the gate spacer layer 148 without departing from the scope of the present disclosure.

As shown in FIG. 2L, recesses 150 are formed extending through the semiconductor layers 116, the sacrificial semiconductor layers 118, and at least partially into the substrate 102. The recesses 150 may be formed by any suitable technique, including by selectively removing portions of the semiconductor layers 116, the sacrificial semiconductor layers 118, and the substrate 102. In some embodiments, the recesses 150 may be formed by etching the semiconductor layers 116, the sacrificial semiconductor layers 118, and the substrate 102 using the dummy gate structures 147 as a mask. The formation of recesses 150 concurrently forms or defines the semiconductor nanostructures 106 from the remaining portions of the semiconductor layers 116. Similarly, sacrificial semiconductor nanostructures 151 are formed or defined by the remaining portions of the sacrificial semiconductor layers 118.

Each dummy gate structure 147 corresponds to a position at which a transistor will be formed. More particularly, gate electrodes 108 will eventually be formed in place of the dummy gate structures 147 and the sacrificial semiconductor nanostructures 151. Each stack of semiconductor nanostructures 106 will correspond to the channel regions of a respective transistor. FIG. 2L illustrates the locations of two transistors. The two transistors may share a common source/drain region 110 as will be set forth in further detail below.

As shown in FIG. 2M, lateral portions of the sacrificial semiconductor nanostructures 151 are removed and replaced with inner spacers 154. The lateral portions of the sacrificial semiconductor nanostructures 151 may be removed by any suitable technique, including, for example, by an etching process to laterally recess the sacrificial semiconductor nanostructures 151 with respect to the semiconductor nanostructures 106. The etching process can be performed by a chemical bath that selectively etches the sacrificial semiconductor nanostructures 151 with respect to the semiconductor nanostructures 106. The etching process is timed so that the sacrificial semiconductor nanostructures 151 are recessed but not entirely removed. The recessing process is utilized to enable the formation of an inner spacer layer between the semiconductor nanostructures 106 at the locations where the sacrificial semiconductor nanostructures 151 have been recessed.

The inner spacers 154 are formed by any suitable technique (e.g., by deposition) at the sides of the sacrificial semiconductor nanostructures 151. The inner spacers 154 can be deposited by an ALD process, a CVD process, or other suitable processes. In one example, the inner spacers 154 includes silicon nitride.

FIG. 2N is a Y-view of the semiconductor device 100, and FIG. 2O is an X-view of the semiconductor device 100 taken along the cut line N of FIG. 2N.

As shown in FIG. 2N source/drain regions 110 have been formed. The source/drain regions 110 include semiconductor material. In some embodiments, the source/drain regions 110 may be grown epitaxially from the semiconductor nanostructures 106. The source/drain regions 110 can be epitaxially grown from the semiconductor nanostructures 106 and from the substrate 102. The source/drain regions 110 can be doped with N-type dopants species in the case of N-type transistors, and can be doped with P-type dopant species in the case of P-type transistors. The doping can be performed in-situ during the epitaxial growth. In some embodiments, the source/drain regions 110 may have a thickness between 2 nm and 10 nm. The source/drain regions 110 may be in direct contact with the semiconductor nanostructures 106.

As shown in FIG. 2O, the source/drain regions 110 extend between adjacent hybrid fin structures 133. In some embodiments, the source/drain regions 110 may have a top surface that extends to a level that is higher than a level of an upper surface of the hybrid fin structures 133. As shown, the high-K dielectric layer 138 may remain on the hybrid fin structures 133 during formation of the source/drain regions 110.

FIG. 2P is a Y-view of the semiconductor device 100, and FIG. 2Q is an X-view of the semiconductor device 100 taken along the cut line P of FIG. 2P. As shown in FIG. 2Q, the high-K dielectric layer 138 is removed. The high-K dielectric layer 138 may be removed by any suitable process, which in some embodiments may include by an etching process. After removal of the high-K dielectric layer 138, upper surfaces of the hybrid fin structures 133 are exposed. For example, upper surfaces of the first and second dielectric layers 134, 136 may be exposed by the removal of the high-K dielectric layer 138.

FIG. 2R is a Y-view of the semiconductor device 100, and FIG. 2S is an X-view of the semiconductor device 100 taken along the cut line R of FIG. 2R.

As shown in FIG. 2R, a dielectric layer 158 has been deposited on sidewalls of the gate spacer layers 148 and on top of the source/drain regions 110. The dielectric layer 158 can include silicon nitride or another suitable material and can be deposited by ALD, CVD, or PVD. A dielectric layer 160 has been deposited on the dielectric layer 158. The dielectric layer 160 can include silicon oxide or another suitable material and can be deposited by ALD, CVD, or PVD. Other materials and deposition processes can be utilized for the dielectric layers 158 and 160 without departing from the scope of the present disclosure.

As shown in FIG. 2S, the dielectric layers 158 and 160 are deposited on the hybrid fin structures 133.

In some embodiments, the semiconductor device 100 may be planarized, for example by CMP, resulting in a planarized upper surface. The planarization may remove the dielectric layers 144 and 146, and may remove corresponding portions of the gate spacer layer 148. The planarization may expose an upper surface of the polysilicon layer 142. In some embodiments, upper surfaces of the dielectric layers 158 and 160, the gate spacer layer 148, and the polysilicon layer 142 may be substantially coplanar with one another.

FIG. 2T is substantially the same as the view illustrated in FIG. 2R, however, additional details are shown in FIG. 2T, which may be included in some embodiments. For example, portions of the dielectric layers 144, 146 may remain overlying portions of the polysilicon layer 142 on each of the fin structures, and the dielectric layers 158 and 160 may extend over the fin structures and between the fin structures as shown in FIG. 2T.

FIG. 2U is a Y-view of the semiconductor device 100, and FIG. 2V is an X-view of the semiconductor device 100 taken along the cut line T of FIG. 2U.

As shown in FIG. 2U, a metal gate 135 is formed, and the metal gate 135 includes a gate electrode 108 and a gate dielectric layer 166. Further, as shown in FIG. 2U, the dummy gates 147 have been removed. The dummy gates 147 may be removed by any suitable technique, and in some embodiments, the dummy gates 147 may be removed by one or more etching steps. The etching steps may include etching steps to remove the dielectric layer 146, then the dielectric layer 144, then the polysilicon layer 142, then the dielectric layer 140. Various other processes can be performed to remove the dummy gate structures 147 without departing from the scope of the present disclosure.

As shown in FIG. 2U, the sacrificial semiconductor nanostructures 151 have been removed. The sacrificial semiconductor nanostructures 151 can be removed after removal of the dummy gates 147. The sacrificial semiconductor nanostructures 151 can be removed with an etching process that selectively etches the sacrificial semiconductor nanostructures 151 with respect to the semiconductor nanostructures 106 and the inner spacers 154. Various other processes can be utilized to remove the sacrificial semiconductor nanostructures 151 without departing from the scope of the present disclosure.

As shown in FIG. 2U, an interfacial dielectric layer 165 is formed on exposed surfaces of the semiconductor nanostructures 106. The interfacial dielectric layer 165 may be formed by any suitable technique, including, for example, by a deposition process.

The interfacial dielectric layer 165 may include a dielectric material such as silicon oxide, silicon nitride, or other suitable dielectric materials. The interfacial dielectric layer 165 may include a comparatively high-K dielectric with respect to high-K dielectric such as hafnium oxide or other high-K dielectric materials that may be used in gate dielectrics of transistors.

The interfacial dielectric layer 165 may be formed by a thermal oxidation process, a chemical vapor deposition (CVD) process, or an atomic layer deposition (ALD) process. In some embodiments, the interfacial dielectric layer 165 may have a thickness between 0.5 nm and 2 nm. One consideration in selecting a thickness for the interfacial dielectric layer is to leave sufficient space between the nanosheets 106 for gate metals, as will be explained in more detail below. Other materials, deposition processes, and thicknesses can be utilized for the interfacial dielectric layer without departing from the scope of the present disclosure.

As shown in FIG. 2U, a gate dielectric is formed. The gate dielectric may include the interfacial dielectric layer 165 and a high-K gate dielectric layer 166 positioned on the interfacial dielectric layer 165. Together, the interfacial dielectric layer 165 and the high-K gate dielectric layer 166 form a gate dielectric for the gate all around nanosheet transistors.

The high-K gate dielectric layer 166 and the interfacial dielectric layer 165 physically separate the semiconductor nanostructures 106 from the gate metals that will be deposited in subsequent steps. The high-K gate dielectric layer 166 and the interfacial dielectric layer 165 isolate the gate metals from the semiconductor nanostructures 106 that correspond to the channel regions of the transistors.

The high-K gate dielectric layer 166 may include one or more layers of a dielectric material, such as $HfO_2$, HfSiO, HfSiON, HfTaO, HTIO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer 166 may be formed by CVD, ALD, or any suitable method. In some embodiments, the high-K gate dielectric layer 166 is formed using a highly conformal deposition process such as ALD in order to ensure the formation of a gate dielectric layer having a uniform thickness around each semiconductor nanosheet 106. In some embodiments, the thickness of the high-k dielectric 166 is in a range from about 1 nm to about 3 nm. Other thicknesses, deposition processes, and materials can be utilized for the high-K gate dielectric layer 166 without departing from the scope of the present disclosure. The high-K gate dielectric layer 166 may include a first layer that includes $HfO_2$ with dipole doping including La and Mg, and a second layer including a higher-K ZrO layer with crystallization.

After forming the gate dielectric by, for example, deposition of the high-K gate dielectric layer 166, the gate electrode 108 is formed, for example, by depositing a gate metal in the voids formed by removal of the dummy gate structures 147. The gate electrode 108 surrounds the semiconductor nanostructures 106. In particular, the gate electrode 108 is in contact with the gate dielectric, e.g., with the high-K gate dielectric layer 166. The gate electrode 108 is positioned between semiconductor nanostructures 106. In other words, the gate electrode 108 is positioned all around the semiconductor nanostructures 106. For this reason, the transistors formed in relation to the semiconductor nanostructures 106 are called gate all around transistors.

Although the gate electrode 108 is shown as a single metal layer, in practice the gate electrode 108 may include multiple metal layers. For example, the gate electrode 108 may include one or more very thin work function layers in contact with the gate dielectric. The thin work function layers can include titanium nitride, tantalum nitride, or other conductive materials suitable for providing a selected work function for the transistors. The gate electrode 108 can further include a gate fill material that corresponds to the majority of the gate electrode 108. The gate fill material can include cobalt, tungsten, aluminum, or other suitable conductive materials. The layers of the gate electrode 108 can be deposited by PVD, ALD, CVD, or other suitable deposition processes.

In some embodiments, one or more conductive layers may be formed on the gate electrodes 108. For example, a metal layer (not shown) may be formed (e.g., by deposition) on the gate electrodes 108. The metal layer can include tungsten, aluminum, titanium, copper, gold, tantalum, or other suitable conductive materials. The metal layer can be deposited by ALD, PVD, or CVD. Other materials and deposition processes can be utilized for the metal layer. In some embodiments, a cap layer (not shown) may be formed on the metal layer, for example, by deposition. The cap layer can include one or more of SiCN, SiN, or SICON. The cap layer can be deposited by CVD, ALD, or other suitable processes.

As shown in FIG. 2W, portions of the dielectric layer 160, the dielectric layer 158, the first dielectric layer 134, and the second dielectric layer 136 are removed. The layers may be removed by any suitable process. For example, in some embodiments, an etching process may be performed to remove the portions of the dielectric layer 160, the dielectric layer 158, the first dielectric layer 134, and the second dielectric layer 136. The etching process can be performed in one or more steps. The one or more steps selectively etch the portions of the dielectric layer 160, the dielectric layer 158, the first dielectric layer 134, and the second dielectric layer 136 with respect to the material of the source/drain regions 110. The one or more etching steps can include wet etches, dry etches, timed etches, or other types of etching processes.

Upper surfaces of the source/drain regions 110 may be exposed by the removal of the portions of the dielectric layer 160, the dielectric layer 158, the first dielectric layer 134, and the second dielectric layer 136, as shown.

As shown in FIG. 2X, a silicide 172 may be formed on the source/drain regions 110. The silicide 172 is formed on top of the source/drain regions 110 and may be formed on side surfaces of the source/drain regions 110. The silicide 172 may extend over top surfaces of the source/drain regions 110 and may extend along the side surfaces of the source/drain regions 110. In some embodiments, the silicide 172 may be a "wrap around" silicide that covers and contacts at least the top surface and two side surfaces of each of the source/drain regions 110. This increases a contact area between the silicide 172 and the source/drain regions 110.

The silicide 172 can include any suitable silicide. In some embodiments, the silicide 172 includes one or more of titanium silicide, cobalt silicide, ruthenium silicide, aluminum silicide, nickel silicide, or other silicides. The silicide 172 may be formed using any suitable technique. In some embodiments, the silicide 172 can be grown by performing a high-temperature annealing process in the presence of the metal and the silicon from which the silicide 172 is formed. The result of the silicide growth process is that silicide 172 grows from all exposed surfaces of the source/drain regions 110. The silicide 172 can include other materials and deposition processes without departing from the scope of the present disclosure.

The contact between the wrap around silicide 172 and the source/drain regions 110 reduces a contact resistance along a current path through the source/drain regions 110 to the semiconductor nanostructures 106, as the relatively high resistance source/drain material is substantially surrounded (e.g., along at least three sides in some embodiments) by the highly conductive silicide 172.

In some embodiments, the silicide 172 has a thickness (e.g., along the X-axis direction) between 1 nm and 10 nm. In some embodiments, the silicide 172 has a thickness (e.g., along the X-axis direction) between 3 nm and 10 nm. The silicide 172 can have other dimensions and shapes without departing from the scope of the present disclosure.

As shown in FIG. 2X, source/drain contacts 114 have been formed on the silicide 172. The source/drain contacts 114 can include conductive material such as tungsten, cobalt, copper, titanium, aluminum, or other suitable conductive materials by which voltages can be applied to the source/drain regions 110. The source/drain contacts 114 can be formed by PVD, CVD, ALD, or other suitable deposition processes. Other materials and deposition processes can be utilized for the source/drain contacts 114 without departing from the scope of the present disclosure.

The semiconductor device 100 shown in FIG. 2X illustrates the transistors 104*a*, 104*b* after processing of the transistors 104*a*, 104*b* of the first semiconductor device 100 is complete. As such, the semiconductor device 100 may correspond with the first semiconductor device 100 of the semiconductor device 10 or with the first semiconductor device of any of the semiconductor devices described herein. The first transistor 104*a* includes the semiconductor nanostructures 106 and the gate electrode 108 on the left side. The second transistor 104*b* includes the semiconductor nanostructures 106 and the gate electrode 108 on the right side. The first and second transistors 104*a* and 104*b* share a central source/drain region 110. The source/drain region 110 on the left is a source/drain region 110 of the transistor 104*a*. The source/drain region 110 on the right is a source/drain region 110 of the transistor 104*b*.

The gate all around transistors 104*a*, 104*b* function by applying biasing voltages to the gate electrode 108 and to the source and drain contacts 114. The biasing voltages cause a channel current to flow through the semiconductor nanostructures 106 between the source/drain regions 110. Accordingly, the semiconductor nanostructures 106 correspond to channel regions of the gate all around transistors 104*a*, 104*b*.

FIG. 2Y is substantially the same as the view shown in FIG. 2X, with additional or alternative features depicted. For example, FIG. 2Y illustrates the semiconductor device 100 may include a dielectric layer 149 on the gate electrodes 108. In some embodiments, the dielectric layer 149 may be formed as part of a self-aligned contact process flow and the dielectric layer 149 may be a protective layer over the gate which reduces or prevents contact-to-gate shorts. The dielectric layer 149 may be formed of any suitable dielectric material and by any suitable technique, including, for example, by deposition.

In some embodiments, an upper surface of the semiconductor device 100 may be substantially planar. For example, the upper surface may be planarized in some embodiments.

FIGS. 3A-3J are cross-sectional views of a semiconductor device 300 at various stages of processing, according to some embodiments. The semiconductor device 300 includes the first semiconductor device 100 and a second semiconductor device 200. FIGS. 3A through 3J generally illustrate processing of the second semiconductor device 200 to form the semiconductor device 300, which may be a sequential CFET semiconductor device and in some embodiments may be the semiconductor device 10 shown in FIG. 1.

Figure 3A:
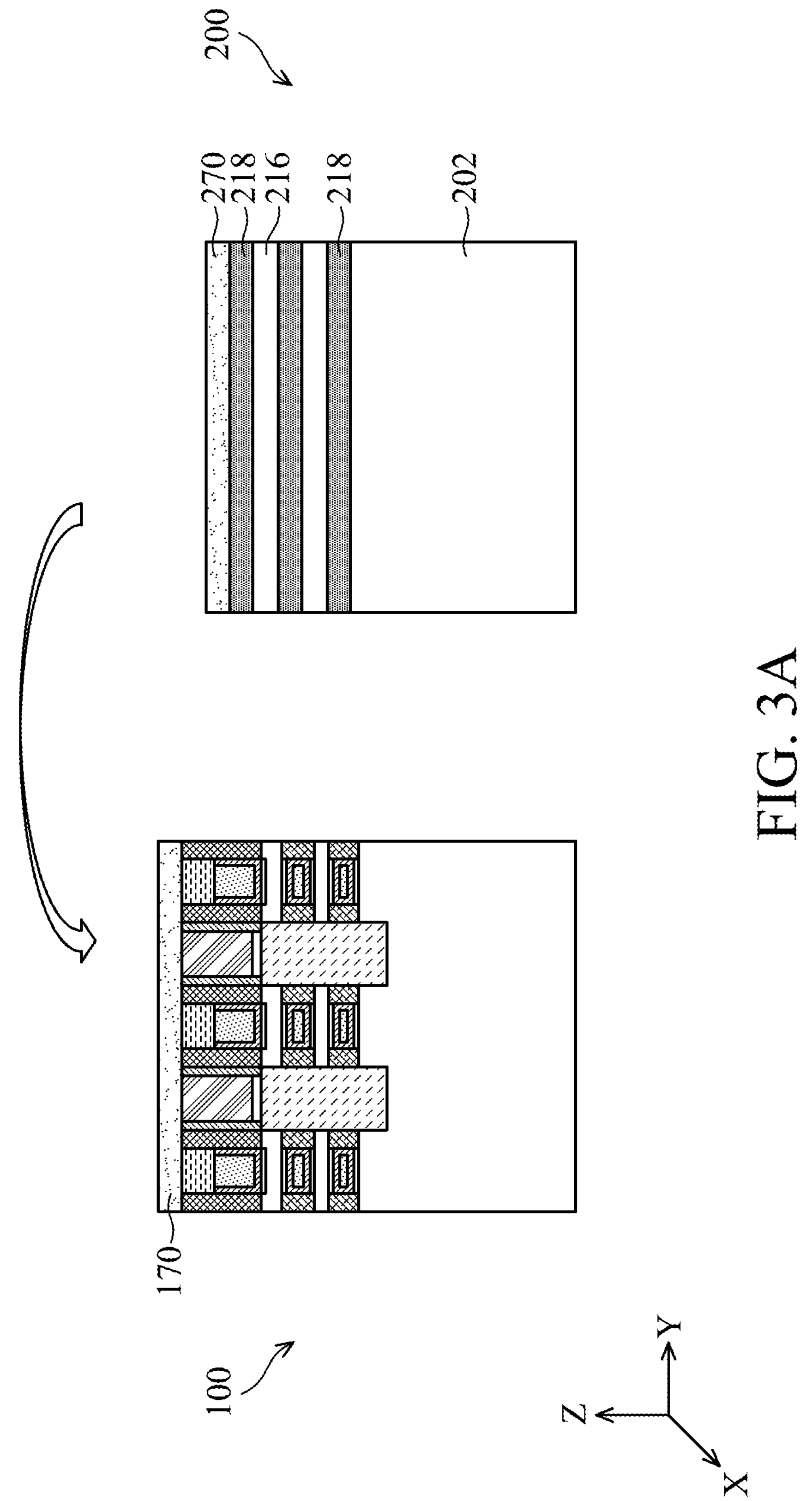

As shown in FIG. 3A, a bonding layer 170 is formed over the first semiconductor device 100. The bonding layer 170 may be formed of any suitable material for bonding the first semiconductor device 100 with the second semiconductor device 200. In some embodiments, the bonding layer 170 is a bonding dielectric layer. In some embodiments, the bonding layer 170 is a dielectric layer including one or more of: SiO, SiOC, SiOCN, SiN, or SION. In some embodiments, the bonding layer 170 is formed of a high thermal conductive material such as AlN, BN, SiC, diamond, BeO, or any other thermally conductive material. In some embodiments, the bonding layer 170 may be the same as the bonding layer 70 of the semiconductor device 10 previously described herein with respect to FIG. 1. In some embodiments, the bonding layer 170 may include a multi-layer structure for different process requirements, for example bonding purpose, thermal conductivity or etch stop layer (e.g., dielectric or metal oxide, or the like), etc.

The bonding layer 170 may be formed by any suitable technique, including for example, by deposition. The bonding layer 170 may be deposited by any suitable technique, including CVD, atomic layer deposition (ALD), or by other suitable deposition processes. Other materials and deposition processes can be utilized to form the bonding layer 170 without departing from the scope of the present disclosure.

In some embodiments, the bonding layer 170 is formed to have a thickness that is less than 100 nm. In some embodiments, the bonding layer 170 has a thickness that is less than 50 nm. In some embodiments, the bonding layer 170 has a thickness that is less than 20 nm. In some embodiments, the bonding layer 170 has a thickness within a range of 15 nm to 50 nm. Forming the bonding layer 170 with a very small thickness advantageously reduces an overall height of the semiconductor device 300, and reduces a distance (e.g., vertical distance) between the first and second semiconductor devices 100, 200.

In some embodiments, surface plasma treatment may be performed to treat, for example, the upper surface of the first semiconductor device 100 prior to formation of the bonding layer 170. Such treatment may raise the surface energy of the materials of the first semiconductor device 100 at the upper surface, which may improve the bonding with the bonding layer 170.

The second semiconductor device 200 may be the same or substantially same as the semiconductor device 100 as described, for example, with respect to FIGS. 2A and 2B. For example, the second semiconductor device 200 may include a substrate 202, semiconductor layers 216, and sacrificial semiconductor layers 218, which may be the same or substantially the same as the substrate 102, semiconductor layers 116, and sacrificial semiconductor layers 118 of the first semiconductor device 100.

Further, as shown in FIG. 3A, a bonding layer 270 may be formed over the second semiconductor device 200. The bonding layer 270 may be the same or substantially the same as the bonding layer 170. In some embodiments, the bonding layer 270 may be formed by the same processes, same materials, and may have the same characteristics as the bonding layer 170. However, embodiments are not limited thereto, and in various embodiments, the bonding layer 270 may be formed by one or more different processes, may be formed of a different material, and may have a different thickness than the bonding layer 170.

Figures 3B, 3C:
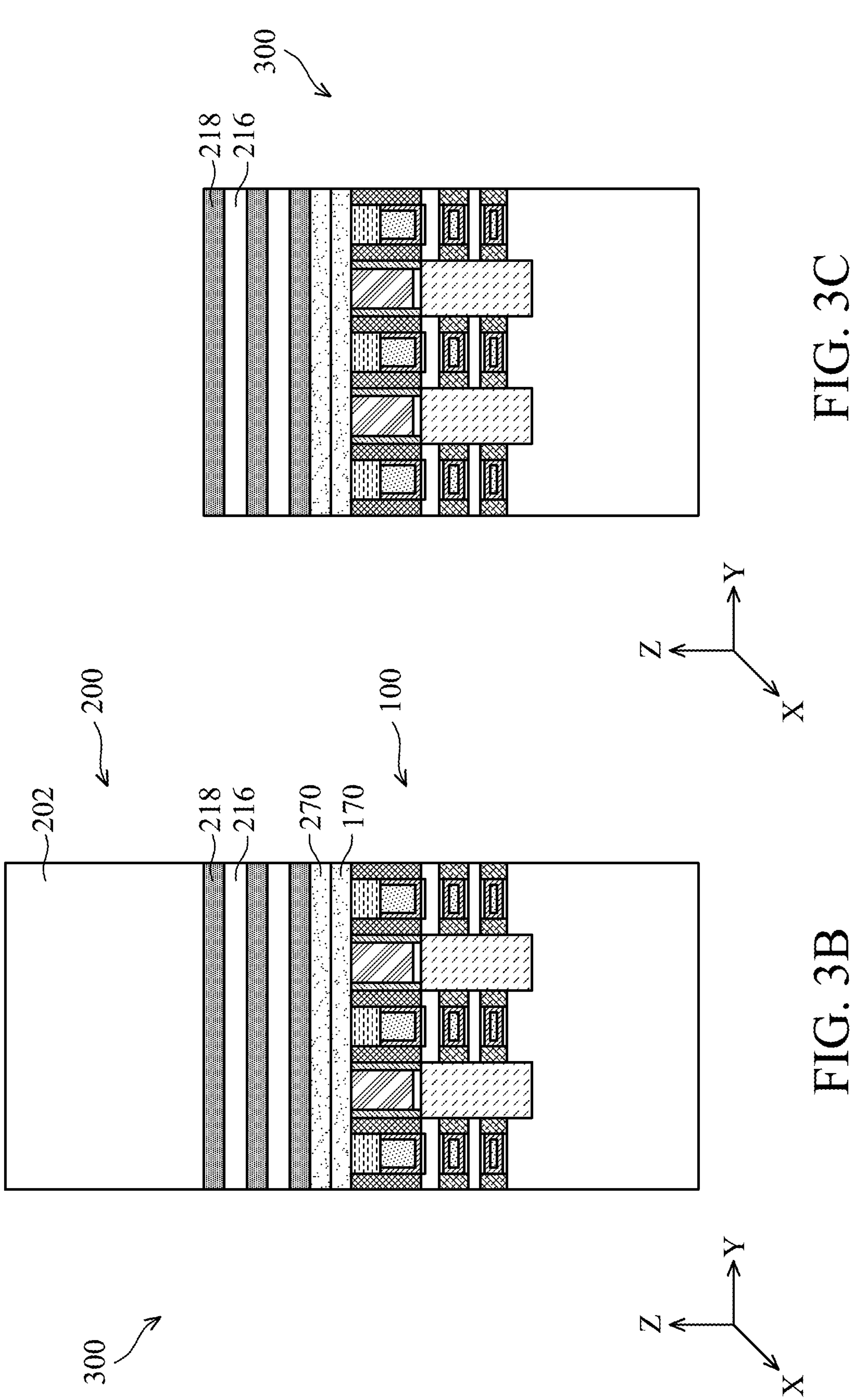

As shown in FIG. 3B, the first and second semiconductor devices 100, 200 are bonded to one another, and will hereinafter be referred to collectively as semiconductor device 300.

The first and second semiconductor devices 100, 200 may be bonded together by any suitable bonding technique. For example, the bonding layers 170, 270 may be brought into contact with one another and bonded together by adhesive bonding, thermal bonding, thermocompression bonding, or any suitable bonding technique. In some embodiments, the second semiconductor device 200 is flipped upside down (e.g, rotated in the direction of the arrow shown in FIG. 3A) and the bonding layers 170, 270 are brought into contact with one another in a bonding or heating chamber having a temperature of about 500° C. or less than 500° C. The thermal bonding process may facilitate bonding of the bonding layers 170, 270, and bonding between the first and second semiconductor devices 100, 200.

As shown in FIG. 3C, the semiconductor device 300 is thinned by at least partially removing the substrate 202 of the second semiconductor device 200. In some embodiments, the substrate 202 is substantially or completely removed, and an uppermost sacrificial semiconductor layer 218 may be exposed at an upper surface of the second semiconductor device 200.

In some embodiments, the substrate 202 is removed by an etching process, and the upper most sacrificial semiconductor layer 218 may be used as an etch stop layer. For example, the sacrificial semiconductor layer 218 may be a SiGe layer, and the substrate 202 may be a silicon substrate, and the etchant may selectively remove the silicon substrate while retaining the SiGe layer.

In some embodiments, the substrate 202 is removed by a polishing process, such as chemical mechanical polishing (CMP), and the upper most sacrificial semiconductor layer 218 may be used as a polish stop layer. For example, the sacrificial semiconductor layer 218 may be a SiGe layer, and the substrate 202 may be as silicon substrate, and the polishing process may selectively remove the silicon substrate while retaining the SiGe layer.

Figures 3D, 3E:
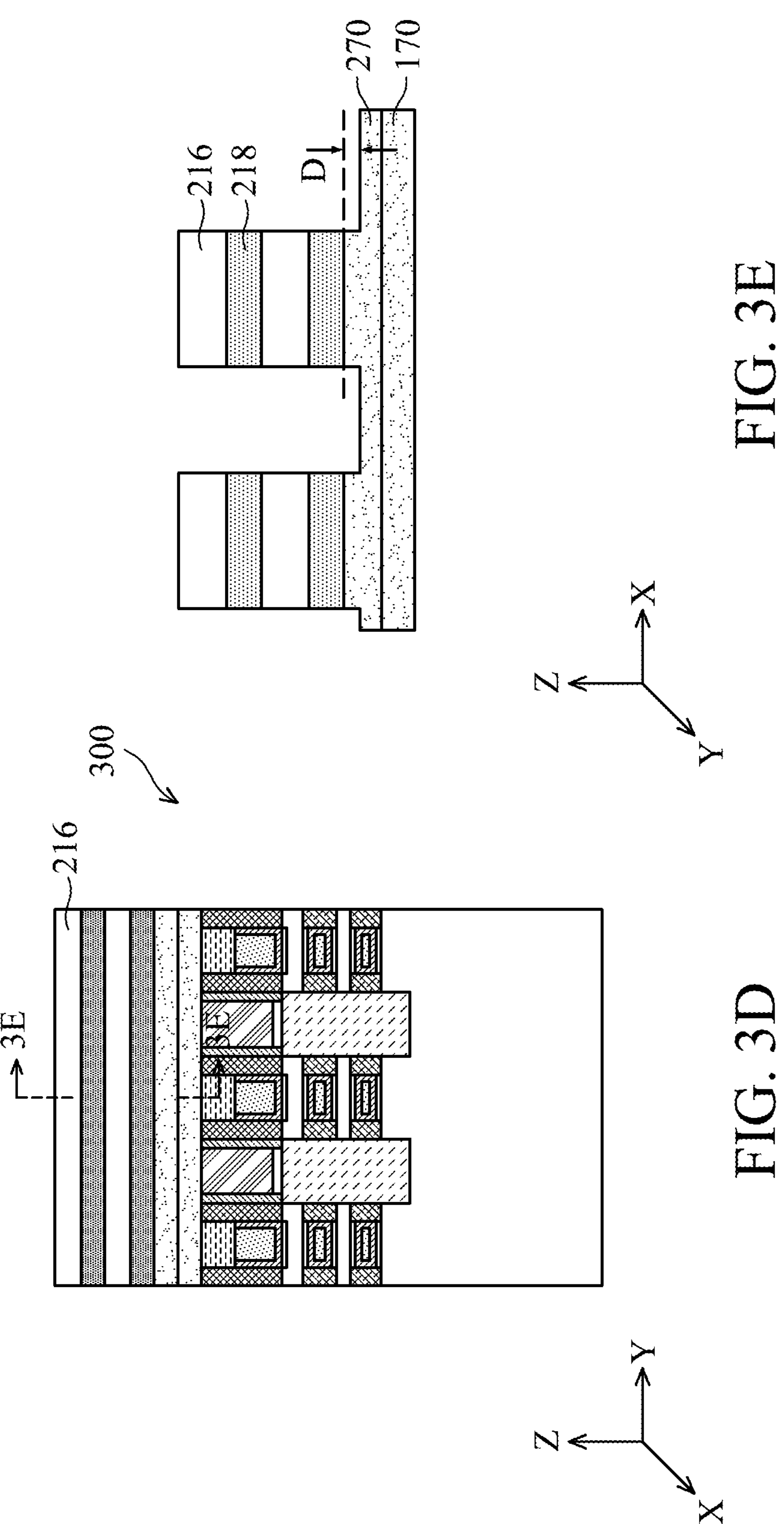

FIG. 3D is a Y-view of the semiconductor device 300, and FIG. 3E is an X-view of the semiconductor device 300 taken along the cut line 3E of FIG. 3D.

As shown in FIGS. 3D and 3E, in some embodiments, the uppermost sacrificial semiconductor layer 218 (e.g., the etch stop layer or polish stop layer) may be removed by any suitable technique, including, by an etching process, a mechanical process, or any other suitable process.

As shown in FIG. 3E, fins are formed by removing portions of the sacrificial semiconductor layers 218 and the semiconductor layers 216. The fins may be formed by any suitable technique, including, for example, as described herein with respect to forming the fin structures 124 in FIG. 2C.

In some embodiments, the fins are formed by an etching process, and at least one of the bonding layers 170, 270 is used as an etch stop layer, in which the etchant is selective to selectively remove portions of the sacrificial semiconductor layers 218 and the semiconductor layers 216, while substantially retaining (or etching at a slower rate) the bonding layers 170, 270. For example, as shown in FIG. 3E, the bonding layer 270 may be etched by a distance D, which is a distance between an upper surface of the bonding layer 270 in a trench or recess between adjacent fins and the upper surface of the bonding layer 270 underneath the fins. That is, the distance D represents a distance or a thickness of the bonding layer 270 that is removed by the etching process, for example, by over-etching during use of the bonding layer 270 as the etch stop layer.

In some embodiments, the distance D is less than 20 nm. In some embodiments, the distance D is less than 10 nm. In some embodiments, the distance D is less than 5 nm. In some embodiments, the distance D is within a range from 5 nm to 10 nm.

Figures 3F, 3G:
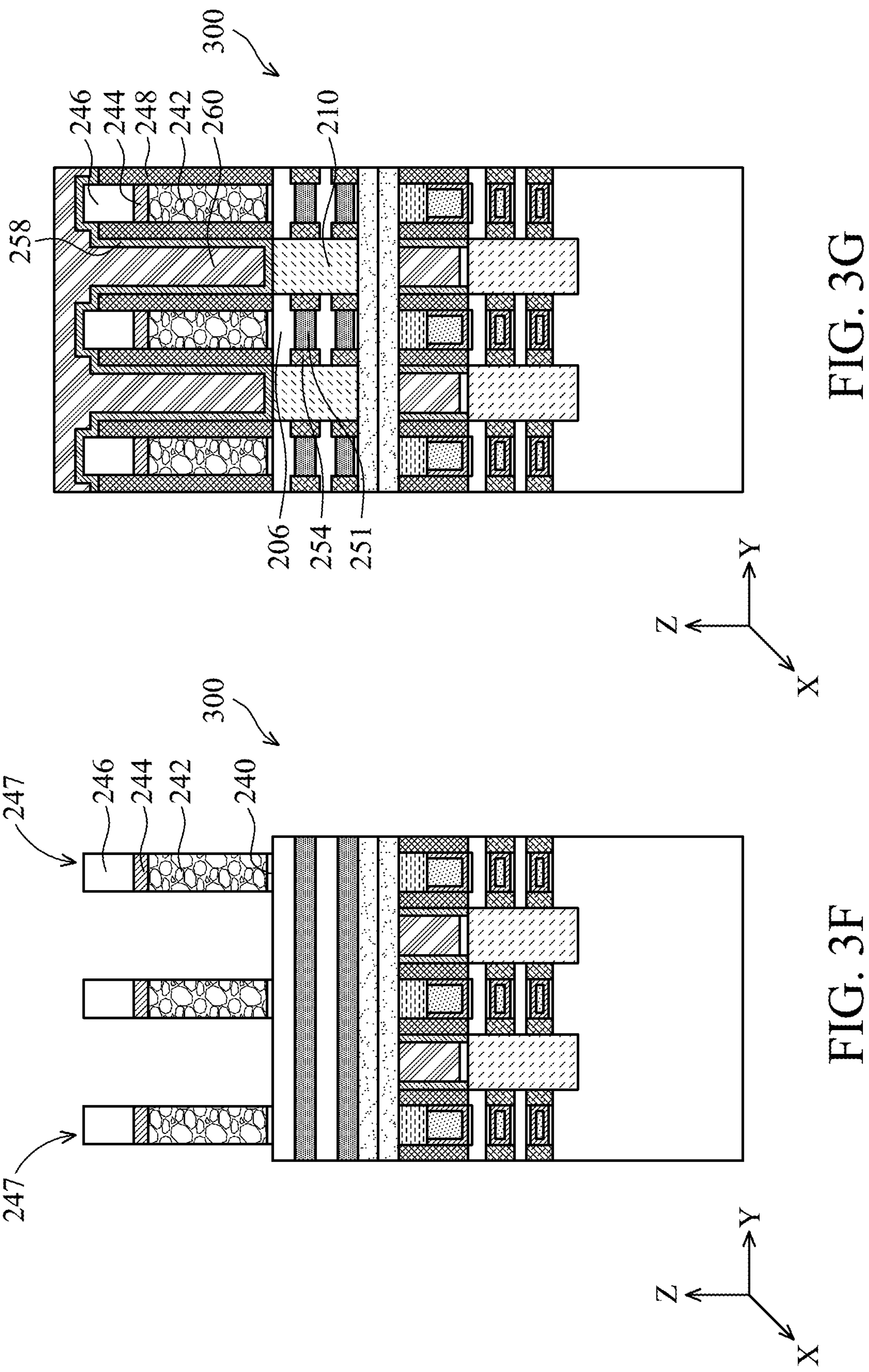

As shown in FIG. 3F, layers 246, 244, 242, and 240 have been patterned and etched to form dummy gate structures 247. The layers 246, 244, 242, and 240 and the dummy gate structures 247 may be the same or substantially the same as the layers 146, 144, 142, and 140 and the dummy gate structures 147, and may be formed by the same or substantially same processes as previously described herein, for example, with respect to forming the structure shown in FIG. 2J.

As shown in FIG. 3G, source/drain regions 210, sacrificial semiconductor nanostructures 251, inner spacers 254, semiconductor nanostructures 206, gate spacer layer 248, and dielectric layers 258, 260 are formed. The source/drain regions 210, sacrificial semiconductor nanostructures 251, inner spacers 254, semiconductor nanostructures 206, gate spacer layer 248, and dielectric layers 258, 260 may be the same or substantially the same as the layers 110, 151, 154, 106, 148, 158, and 160, and may be formed by the same or substantially same processes as previously described herein, for example, with respect to forming the structure shown in FIG. 2T.

Figures 3H, 3I:
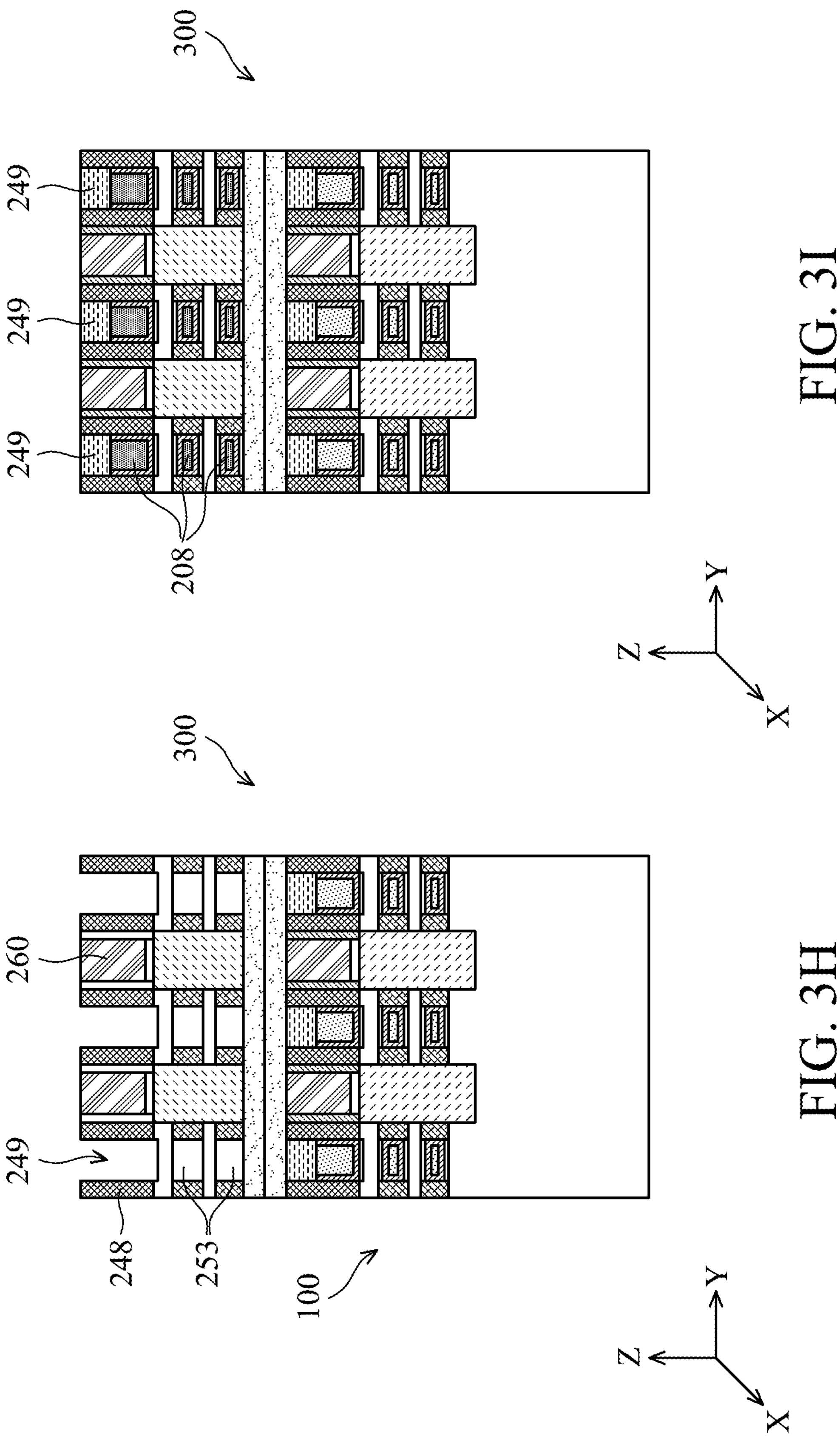

As shown in FIG. 3H, recesses 250 are formed by removal of the dummy gate structures or portions of the layers 242, 244, 246 between adjacent gate spacers 248. Additionally, voids 253 are formed by removing the sacrificial semiconductor nanostructures 251. The dummy gate structures and sacrificial semiconductor nanostructures 251 can be removed by any suitable technique, including, for example, as previously described herein with respect to the dummy gates 147 and sacrificial semiconductor nanostructures 151.

In some embodiments, an upper surface of the semiconductor device 300 may be planarized or may be removed, for example, by CMP or any other suitable process.

As shown in FIG. 3I, gate electrodes 208 are formed, and a dielectric layer 249 is formed on the gate electrodes 208. The gate electrodes 208 and dielectric layer 249 may be formed by any suitable technique, including, for example, as previously described herein with respect to the gate electrode 108 and dielectric layer 149.

Figure 3J:
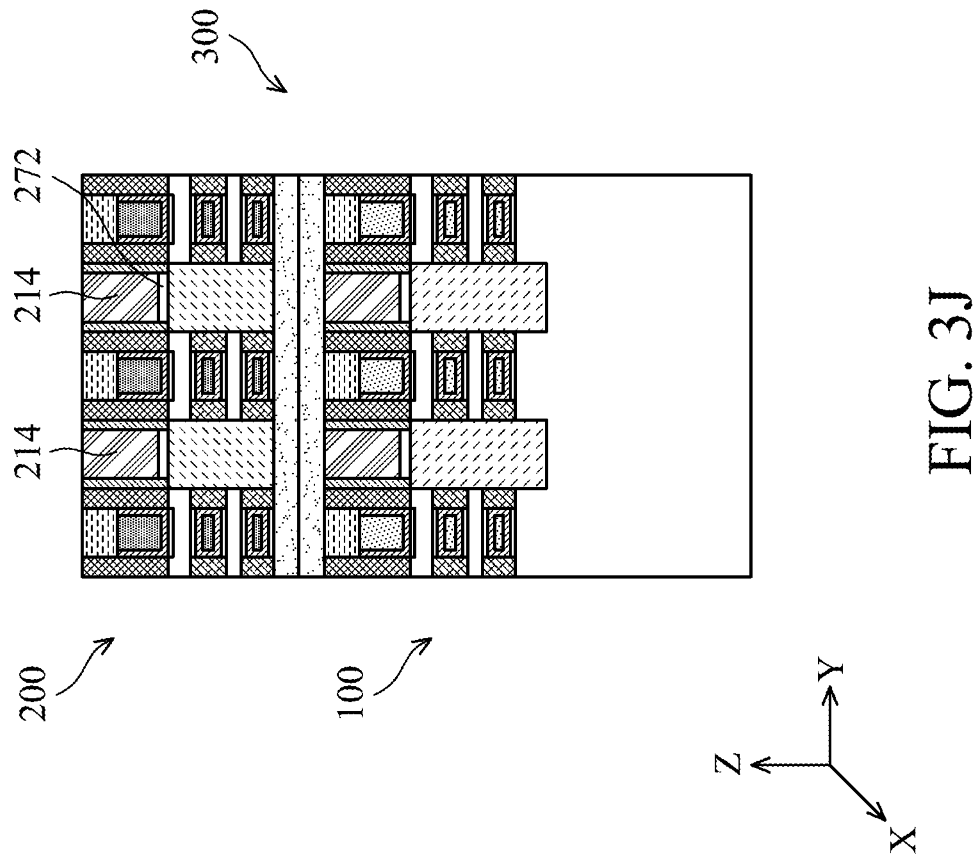

As shown in FIG. 3J, salicide or silicide layers 272 are formed on the source/drain regions 210, and source/drain contacts 214 are formed on the salicide or silicide layers 272. The silicide layers 272 and source/drain contacts 214 may be formed by any suitable technique, including, for example, as previously described herein with respect to the silicide layers 172 and source/drain contacts 114.

As shown in FIG. 3J, the semiconductor device 300 includes two "layers" of source/drain contacts and gate electrodes that are separated by the bonding layers 170, 270. For example, the formation of source/drain contacts 214 and gate electrodes 208 on the second semiconductor device 200 provides a first layer of electrical connection features, while the formation of source/drain contacts 114 and gate electrodes 108 on the first semiconductor device 100 provides a second layer of electrical connection features. This facilitates implementation of the semiconductor device 300 as a sequential CFET device, as each of the source/drain contacts and gate electrodes of the first and second semiconductor devices 100, 200 may be isolated from one another and may be individually and separately accessible, e.g., by electrical connections. This may be advantageous as compared to monolithic CFET devices in which source/drain contacts and gate electrodes are provided in only a single layer.

Figures 4A, 4B:
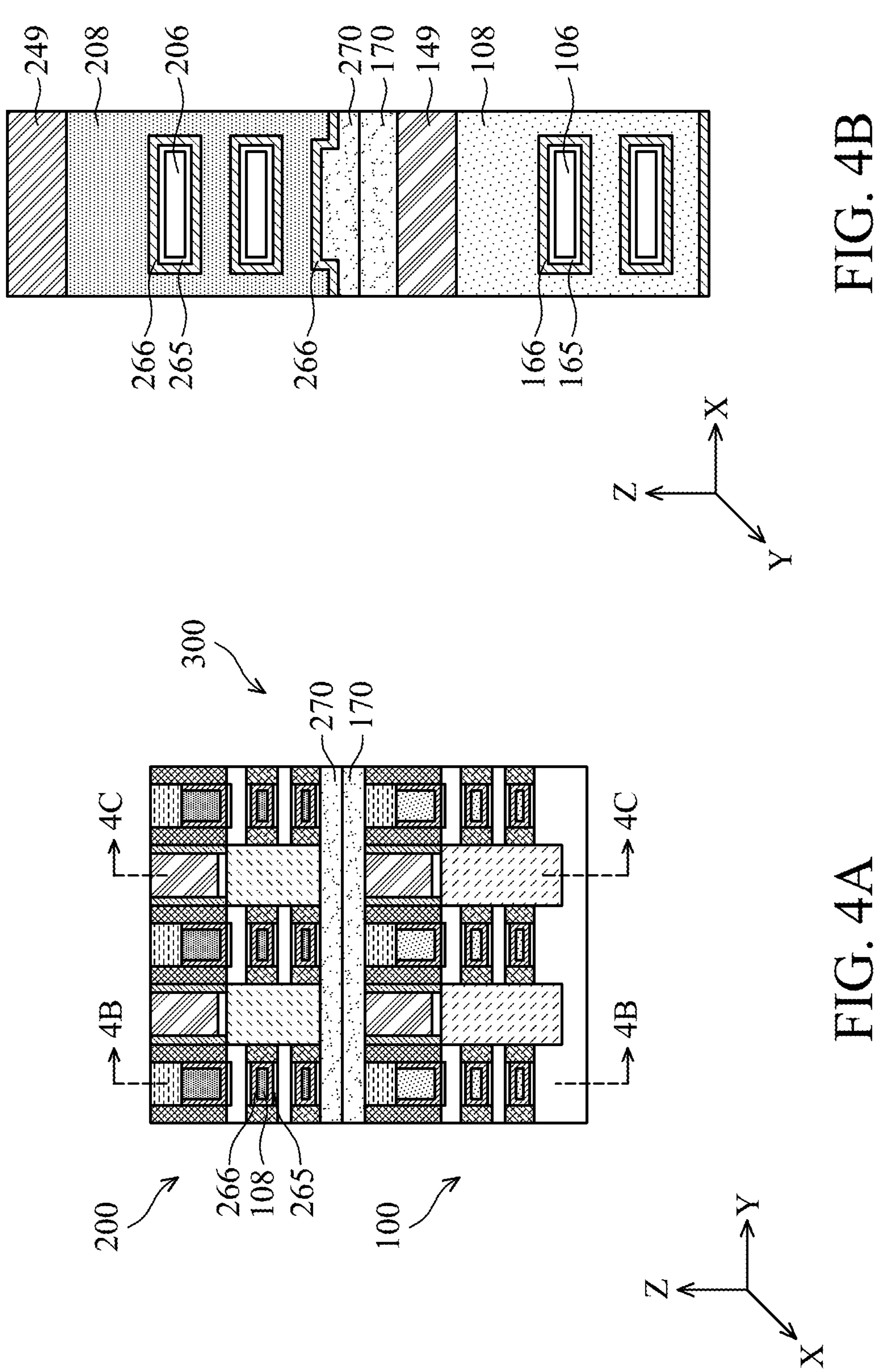
FIG. 4A is a cross-sectional view showing details of the semiconductor device shown in FIG. 3J, in accordance with some embodiments.
FIG. 4B is a cross-sectional view of the semiconductor device taken along the line 4B of FIG. 4A.

FIG. 4A is a cross-sectional view showing details of the semiconductor device 300 shown in FIG. 3J, FIG. 4B is a cross-sectional view of the semiconductor device 300 taken along the line 4B of FIG. 4A, and FIG. 4C is a cross-sectional view of the semiconductor device 300 taken along the line 4C of FIG. 4A.

As shown, the semiconductor device 300 may further include a high-K gate dielectric layer 166, interfacial dielectric layer 165, which may be the same or substantially the same as the high-K gate dielectric layer 266, interfacial dielectric layer 265 previously described herein.

As can be seen in both FIGS. 4B and 4C, the bonding layer 270 may be recessed at lateral edges, which may result from etching processes. For example, the bonding layer 270 may be utilized as an etch stop layer during removal of the dummy gate structures (e.g., as shown in FIG. 3H), and lateral portions of the bonding layer 270 may be removed by over-etching. As a result, as shown in FIG. 4B, the bonding layer 270 may have a stepped or uneven upper surface, with a center portion having a thickness that is greater than the lateral edge portions.

In some embodiments, the bonding layer 270 may have a curved surface, with the center portion having a downward-oriented concave curvature with a thickness in the center that is less than a thickness at the edges. This may be due to the use of the bonding layer 270 as an etch stop layer during removal of the dummy gate structures.

Similarly, in FIG. 4C, the bonding layer 270 may be recessed at lateral edges as a result of an etching process utilized in forming the source/drain regions 210, for example, using the bonding layer 270 as an etch stop layer during formation of the fins as shown in FIG. 3E. The bonding layer 270 may have a center portion having a thickness that is greater than the lateral edge portions, as shown in FIG. 3E. As such, the source/drain regions 210 may have a height H2 at the center region that is less than a height H2' of the source/drain regions 210 at the lateral edge portions.

Additionally, as shown in FIG. 4C, the source/drain regions 110 may have a height H1 that is greater than the height H2 or the height H2' of the source/drain regions 210. This may result because the source/drain regions 110 of the first semiconductor device 100 may be epitaxially grown on silicon sheets and substrate (e.g., on the semiconductor nanostructures 106 and the substrate 102), while the source/drain regions 210 of the second semiconductor device 200 may be grown only on silicon sheets (e.g., on the semiconductor nanostructures 206) and its growth is constrained by the bonding layer 270.

In some embodiments, a void may be formed at or near the bottom of the source/drain regions 210, as the epitaxial layer of the source/drain regions 210 may be laterally grown from silicon sheets (e.g., from the semiconductor nanostructures 206), while the bonding layer 270 is disposed at the bottom of the source/drain regions 210, and the epitaxial layer of the source/drain regions 210 may be unable to be formed directly on or from the bonding layer 270 at the bottom of the source/drain regions 210. As such, one or more voids may be formed at or near the bottom of the source/drain regions 210.

In some embodiments, a difference between the height H2' and the height H2 (e.g., a height of the recess in the bonding layer 270) may be less than 20 nm. In some embodiments, the difference is less than 10 nm. In some embodiments, the difference is less than 5 nm. In some embodiments, the difference is within a range from 5 nm to 10 nm.

Figures 5B, 5C:
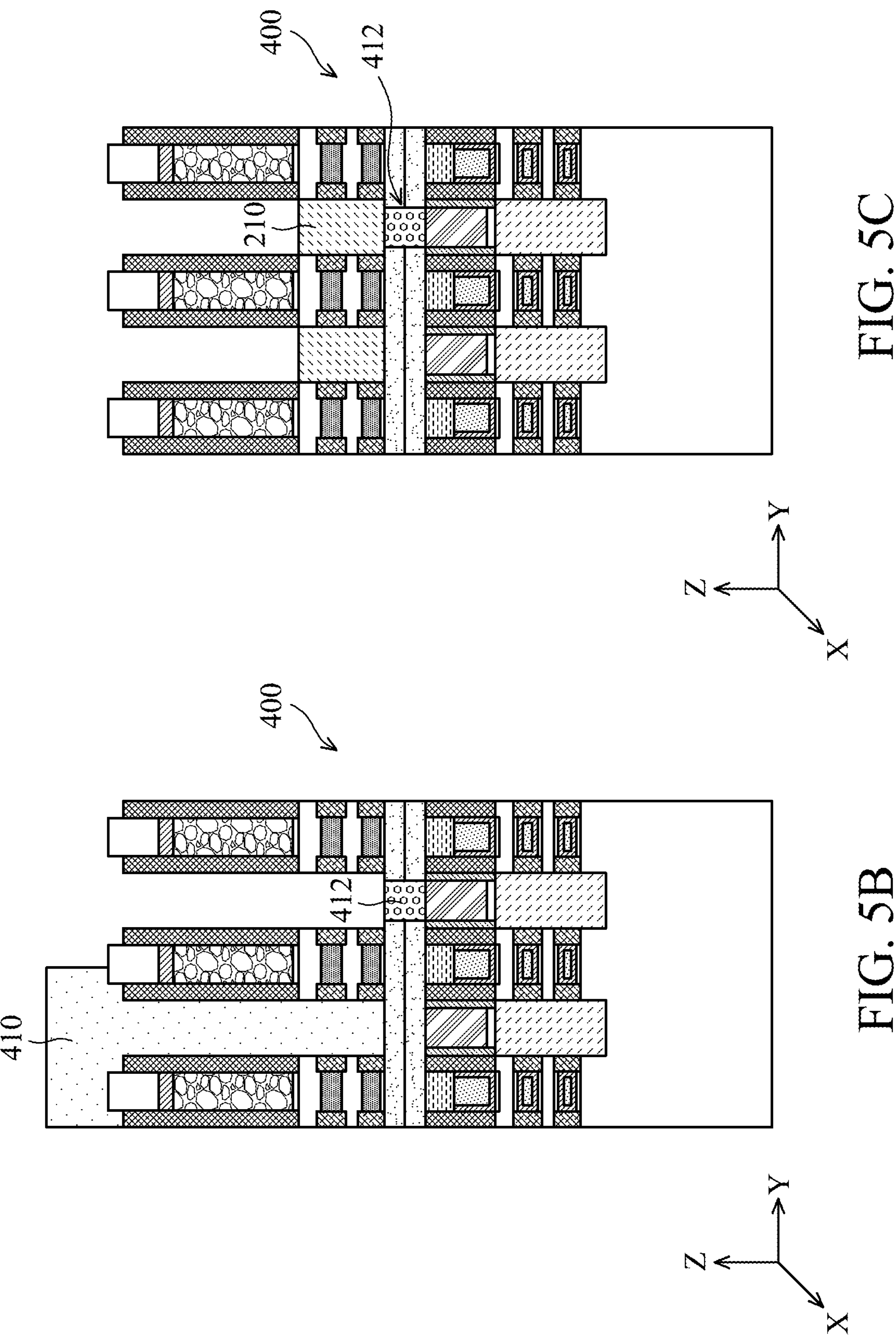

FIGS. 5A through 5C are cross-sectional views of a semiconductor device 400 at various stages of processing, according to some embodiments. The semiconductor device 400 may be substantially the same as the semiconductor device 300, except that the semiconductor device 400 includes an electrically conductive via that electrically connects a source/drain region 110 of the first semiconductor device 100 to a corresponding source/drain region 210 of the second semiconductor device 200.

As shown in FIG. 5A, a mask layer 410 may be formed on and between one or more dummy gate structures 247, while a region between at least two adjacent dummy gate structures 247 is uncovered by the mask layer 410. Prior to formation of the mask layer 410, the semiconductor device 400 shown in FIG. 5A may be substantially the same as the semiconductor device 300 shown in FIG. 3G, except that portions of the dielectric layers 258, 260 have been removed.

The mask layer 410 may be patterned and etched using standard photolithography processes. After the mask layer 410 has been patterned and etched, portions of the bonding layers 170, 270 that are not covered by the mask layer 410 are selectively removed, for example, by an etching process. The etching process results in formation of a recess 411, which may extend through the bonding layers 270, 170 and at least partially expose a surface of an underlying source/drain contact 114.

As shown in FIG. 5B, an electrically conductive via 412 is formed in the recess 411, the via 412 may be formed by any suitable technique, including, for example, using one or more photolithography processes, deposition processes, or any other suitable process.

As shown in FIG. 5C, the mask layer 410 is removed and source/drain regions 210 are formed. The mask layer 410 may be removed by any suitable technique, including by an etching process, a mechanical process, a photolithographic process, or any suitable process.

At least one source/drain region 210 is formed on the via 412. The source/drain region 210 is electrically connected to the via 412 and may be in direct contact with the via 412. The semiconductor device 400 may be further processed as previously described herein, for example, with respect to FIGS. 3G through 3J.

The formation of the conductive via 412 facilitates electrical connection between transistors of the first semiconductor device 100 and transistors of the second semiconductor device 200. In some embodiments, a silicide layer may be disposed between the conductive via 412 and the source/drain region 210.

Figures 6A, 6B:
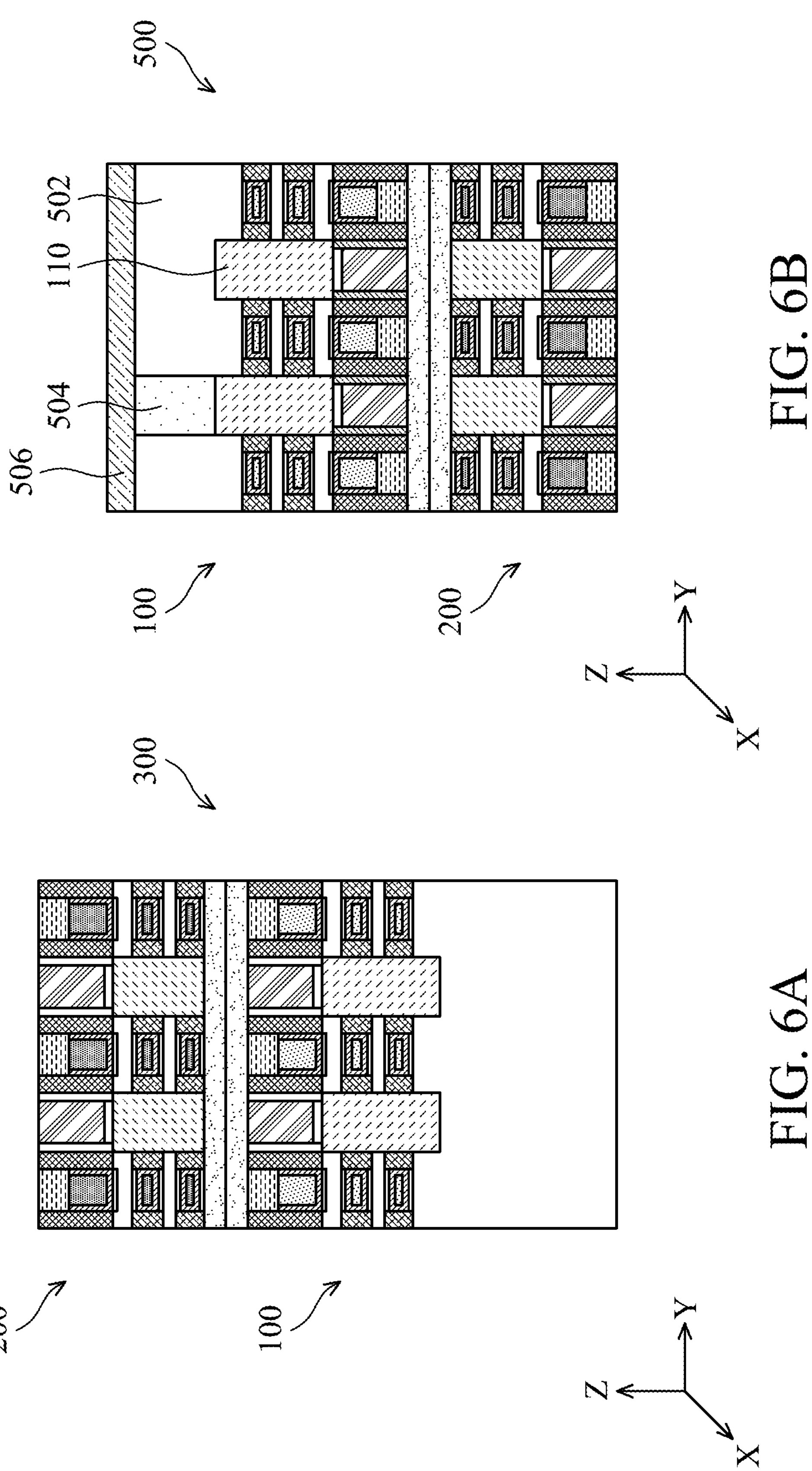
FIGS. 6A and 6B are cross-sectional views of a semiconductor device at various stages of processing, according to some embodiments.

FIGS. 6A and 6B are cross-sectional views of a semiconductor device 500 at various stages of processing, according to some embodiments. More particularly, FIGS. 6A and 6B illustrate example embodiments in which a backside buried power rail is electrically connected to a source/drain region 110.

As shown in FIG. 6A, the semiconductor device 300 may be provided, which may be the same as the semiconductor device 300 shown in FIG. 3J. In some embodiments, the semiconductor device of FIG. 6A may be the semiconductor device 400 which includes one or more vias 412.

As shown in FIG. 6B, the semiconductor device 500 is formed by flipping the semiconductor device 300 over (e.g., rotated 180 degrees about the X-axis) and forming a backside power rail 506 on the backside of the semiconductor device 500. In some embodiments, one of the source/drain regions 110 may be electrically connected through the via 412 (see FIG. 5C), for example, to a source/drain region 210, while another source/drain region 110 may be electrically connected to or through a backside conductive structure, such as the backside contact 504.

In some embodiments, the substrate 102 of the first semiconductor device 100 is removed and is replaced with an insulating layer 502. The insulating layer 502 may be formed of any electrically insulating or dielectric material. In some embodiments, the insulating layer 502 may be formed of silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the insulating layer 502 without departing from the scope of the present disclosure.

A backside contact 504 may be formed extending through the insulating layer 502 and contacting a source/drain region 110 of the first semiconductor device 100, which may be disposed at a backside of the device 500, while the second semiconductor device 200 may be disposed at the front side of the device 500.

The backside contact 504 may be formed by any suitable technique, including, for example, by forming a recess extending through the insulating layer 502 or the substrate 102 by an etching process and depositing a conductive material of the backside contact 504 in the recess.

A backside power rail 506 is formed on the backside of the semiconductor device 500. The backside power rail 506 may be formed on the insulating layer 502, or on the substrate 102 in some embodiments. The backside power rail 506 may be formed by any suitable technique, including by one or more photolithographic processes, deposition processes, etching processes, or any other semiconductor device manufacturing process.

In some embodiments, the backside power rail 506 includes one or more conductive layers and one or more dielectric layers between the conductive layers. The backside power rail 506 may further include one or more electrically conductive connection elements, such as vias or the like, which may electrically couple conductive lines or other electrical features of the backside power rail 506 to one another.

The inclusion of the backside power rail 506 in the semiconductor device 500 facilitates reduction of routing congestion at the front side of the device 500, for example, as one or more electrical connections to the transistors or other electrical features of first semiconductor device 100 may be made at the backside via the backside power rail 506, thereby avoiding routing congestion which may result from routing electrical connections to and from the transistors of the first semiconductor device 100 to the front side of the device 500.

Figures 7A, 7B:
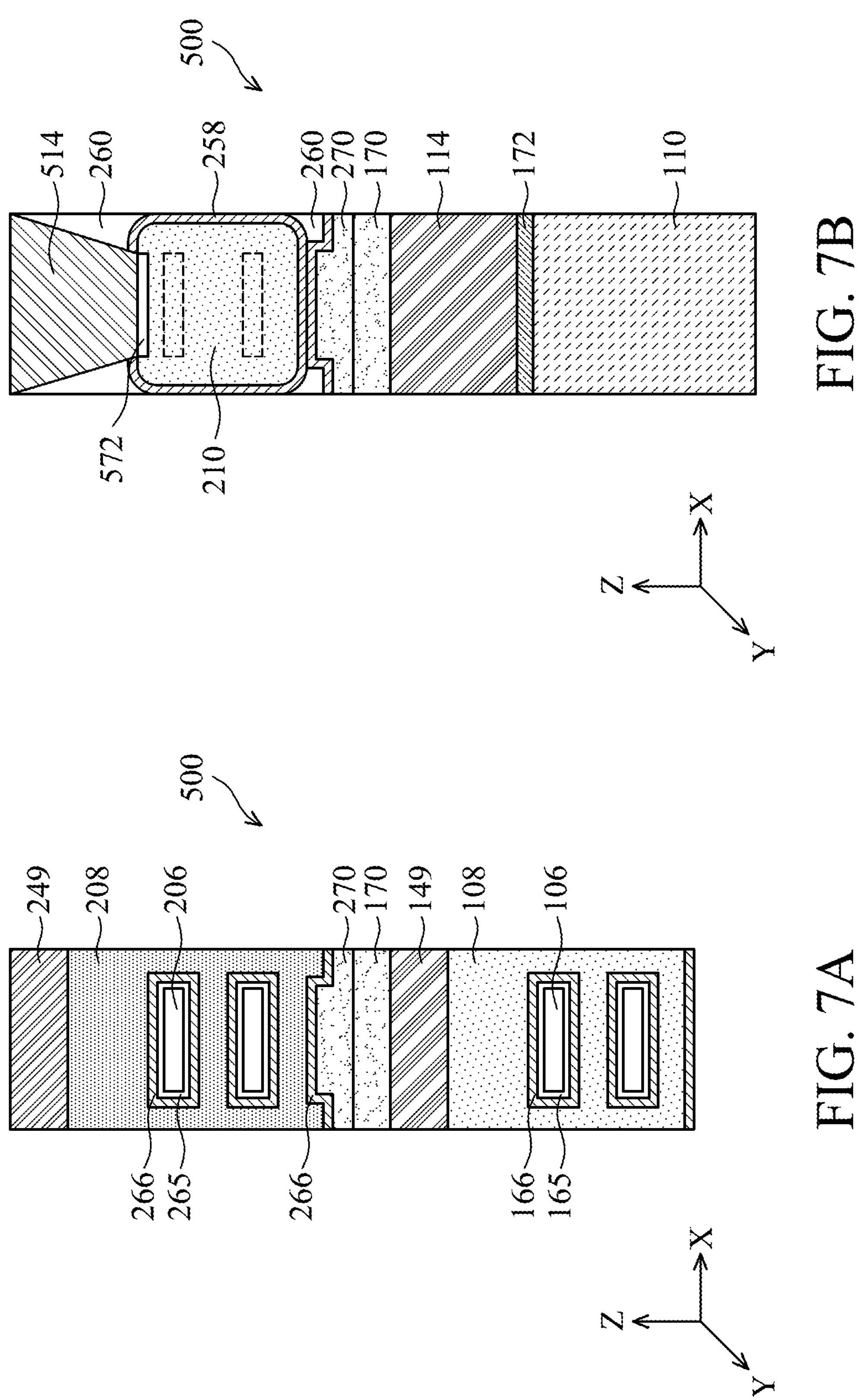
FIGS. 7A and 7B are cross-sectional views showing further details of a semiconductor device, in accordance with some embodiments.

FIGS. 7A and 7B are cross-sectional views showing further details of the semiconductor device 500 in accordance with some embodiments. FIG. 7A is taken along a line corresponding to the line 4B of FIG. 4A, and FIG. 7B is a cross-sectional view of the semiconductor device 500 taken along a line corresponding to the line 4C of FIG. 4A.

As shown in FIG. 7A, the semiconductor device 500 is the same or substantially the same in cross-section as the semiconductor device 300 shown in FIG. 4B. However, as shown in FIG. 7B, along the cross-sectional cutline extending through the source/drain regions 110, 210, there are differences.

For example, in some embodiments, the source/drain region 210 of the semiconductor device 500 may be formed to have a reduced size (e.g., reduced lateral or vertical dimensions), and the dielectric layer 258 may at least partially surround the source/drain region 210. Moreover, the dielectric layer 260 may extend laterally inward toward the source/drain region 210, for example, between the bonding layer 270 and the source/drain region 210.

In some embodiments, a salicide or silicide layer 572 is formed on the source/drain region 210, and a source/drain contact 514 is formed on the salicide or silicide layer 572. The silicide layer 572 and source/drain contact 514 may be formed by any suitable technique, including, for example, as previously described herein with respect to the silicide layers 172 and source/drain contacts 114. In some embodiments, the source/drain contact 514 is the backside contact 504 shown in FIG. 6B.

FIGS. 8A through 8F are cross-sectional views schematically illustrating various semiconductor devices, in accordance with some embodiments of the present disclosure. The semiconductor devices shown in FIGS. 8A through 8F may be formed by any of the processes described herein, and may include any of the features of the semiconductor devices described herein. The semiconductor devices are illustrated schematically in FIGS. 8A through 8F in order to describe the particular features depicted.

Figure 8B:
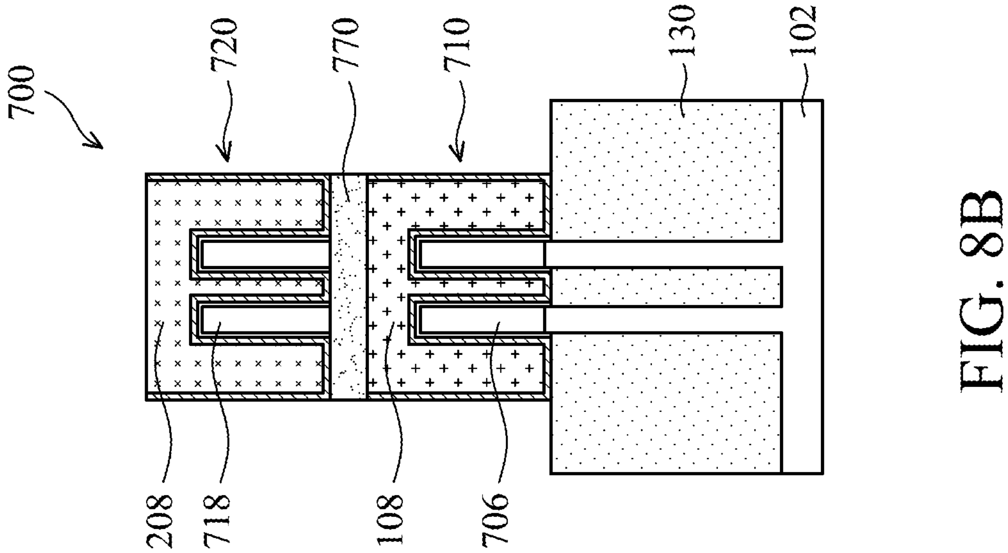
FIGS. 8A through 8F are cross-sectional views schematically illustrating various semiconductor devices, in accordance with some embodiments of the present disclosure.
Figure 8A:
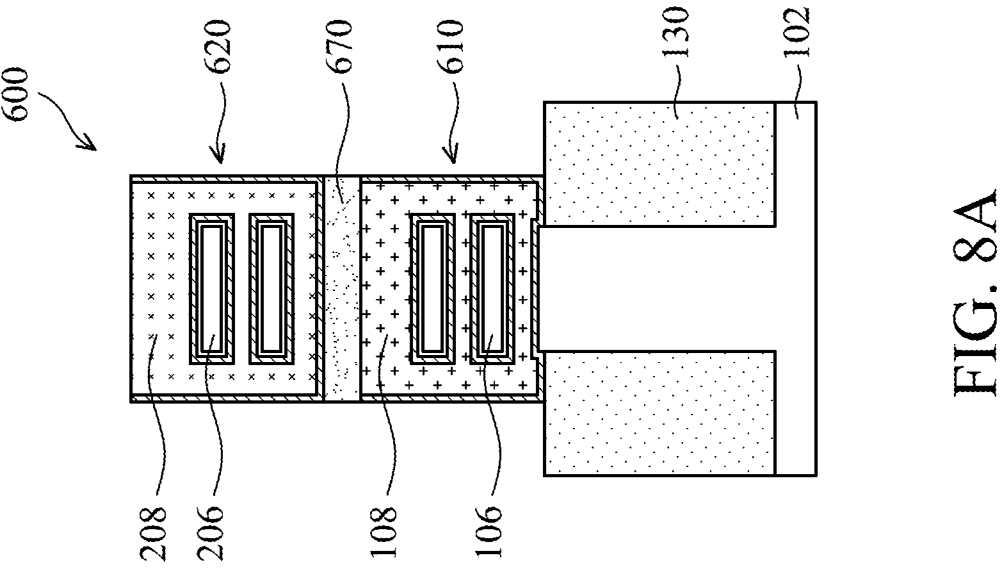

As shown in FIG. 8A, a semiconductor device 600 may include a first semiconductor device 610 and a second semiconductor device 620. The first and second semiconductor devices 610, 620 may be or may include any features or functionalities of the semiconductor devices described herein, such as for example, the first and second semiconductor devices 100, 200, and may be formed on a substrate 102 having shallow trench isolation regions 130.

Each of the first and second semiconductor devices 610, 620 includes a respective stack of semiconductor nanosheets or nanostructures 106, 206 that are generally aligned horizontally, with a width extending along a horizontal direction as shown in FIG. 8A. A bonding layer 670 is disposed between the first and second semiconductor devices 610, 620. The bonding layer 670 may be the same or substantially the same as the bonding layers 170, 270, and in some embodiments, the bonding layer 670 may include both the bonding layers 170, 270.

In some embodiments, the nanostructures 106 of the first semiconductor device 610 have a conductivity type that is different than a conductivity type of the nanostructures 206 of the second semiconductor device 620. For example, the nanostructures 106 may be formed of a semiconductor material such as silicon that is doped with P-type dopant species, while the nanostructures 206 may be formed of a semiconductor material such as silicon that is doped with N-type dopant species.

In various embodiments, the nanostructures 106 of the first semiconductor device 610 have a crystal lattice structure that is the same as or different as than a crystal lattice structure of the nanostructures 206 of the second semiconductor device 620. For example, the nanostructures 106 and the nanostructures 206 may be formed of silicon having a Miller index of lattice plane of (100) and a Miller index for direction of channel current flow of <110>. In some embodiments, however, the nanostructures 106 may be formed of silicon having a Miller index of lattice plane of (110) and a Miller index for direction of channel current flow of <110>, while the nanostructures 206 may be formed of silicon having a Miller index of lattice plane of (100) and a Miller index for direction of channel current flow of <100>.

As shown in FIG. 8B, a semiconductor device 700 may include a first semiconductor device 710 and a second semiconductor device 720. Each of the first and second semiconductor devices 710, 720 includes a respective plurality of semiconductor structures 706, 718 that are generally aligned vertically, with a height extending along a vertical direction as shown in FIG. 8B. The semiconductor structures 706, 718 may be fins of FinFET transistors, in some embodiments, with the gate electrodes 108, 208 disposed on lateral and upper sides of the semiconductor structures 706, 718. The semiconductor structures 706, 718 may form channel regions of transistors of the semiconductor device 700, and may generally correspond to the semiconductor nanostructures described herein, except that the semiconductor structures 706, 718 may be included as part of FinFET transistors while the nanostructures may be included as part of a gate-all-around transistor.

A bonding layer 770 is disposed between the first and second semiconductor devices 710, 720, which may include one or both the bonding layers 170, 270.

In some embodiments, the semiconductor structures 706 of the first semiconductor device 710 have a conductivity type (e.g., P-type) that is different than a conductivity type (e.g., N-type) of the semiconductor structures 718 of the second semiconductor device 720.

In various embodiments, the semiconductor structures 706 of the first semiconductor device 710 have a crystal lattice structure that is the same as or different as than a crystal lattice structure of the semiconductor structures 718 of the second semiconductor device 720. For example, the semiconductor structures 706, 718 may be formed of silicon having a Miller index of lattice plane of (100) and a Miller index for direction of channel current flow of <110>. In some embodiments, however, the semiconductor structures 706 may be formed of silicon having a Miller index of lattice plane of (110) and a Miller index for direction of channel current flow of <110>, while the semiconductor structures 718 may be formed of silicon having a Miller index of lattice plane of (100) and a Miller index for direction of channel current flow of <100>.

Figure 8D:
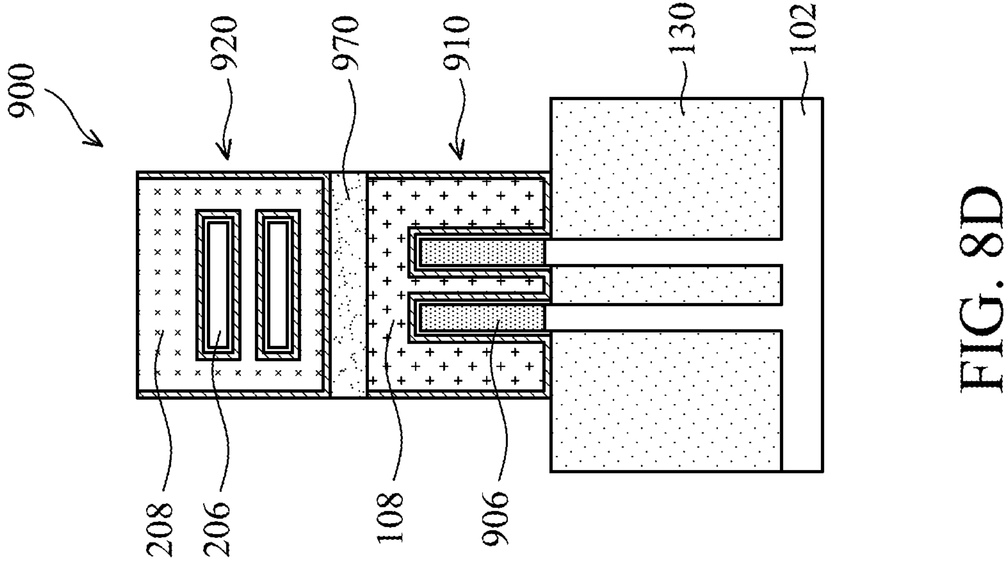
Figure 8C:
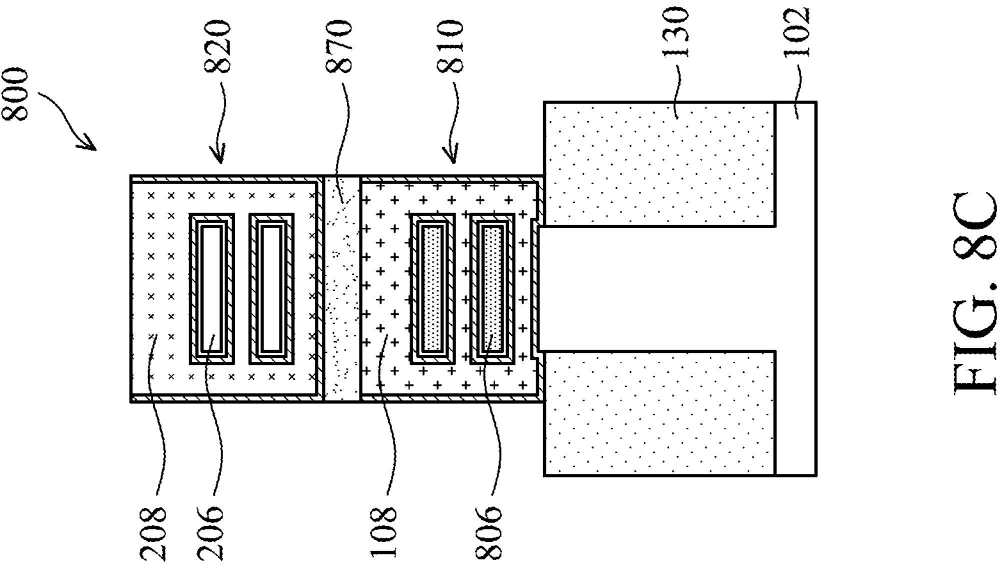

As shown in FIG. 8C, a semiconductor device 800 may include a first semiconductor device 810 and a second semiconductor device 820. The semiconductor device 800 of FIG. 8C is substantially the same as the semiconductor device 600 of FIG. 8A except for the differences that will be discussed herein. In particular, the first semiconductor device 810 of the semiconductor device 800 includes nanostructures 806 that are formed of a different semiconductor material than the nanostructures 206 of the second semiconductor device 820. In some embodiments, the nanostructures 806 are formed of SiGe, while the nanostructures 106 are formed of silicon.

In some embodiments, the nanostructures 806 of the first semiconductor device 810 have a conductivity type (e.g., P-type) that is different than a conductivity type (e.g., N-type) of the nanostructures 106.

A bonding layer 870 is disposed between the first and second semiconductor devices 810, 820, which may include one or both the bonding layers 170, 270.

As shown in FIG. 8D, a semiconductor device 900 may include a first semiconductor device 910 that includes one or more FinFET transistors, for example, including semiconductor structures 906 which are formed as fins generally extending in a vertical direction. The second semiconductor device 920 may include one or more gate-all-around transistors, for example, including the semiconductor nanostructures 206 which are oriented horizontally as shown.

In various embodiments, the semiconductor structures 906 may be formed of a same or different material as the nanostructures 206. In some embodiments, the semiconductor structures 906 are formed of SiGe, while the semiconductor nanostructures 206 are formed of silicon.

In some embodiments, the semiconductor structures 906 of the first semiconductor device 910 have a conductivity type (e.g., P-type) that is different than a conductivity type (e.g., N-type) of the nanostructures 206.

A bonding layer 970 is disposed between the first and second semiconductor devices 910, 920, which may include one or both the bonding layers 170, 270.

Figure 8F:
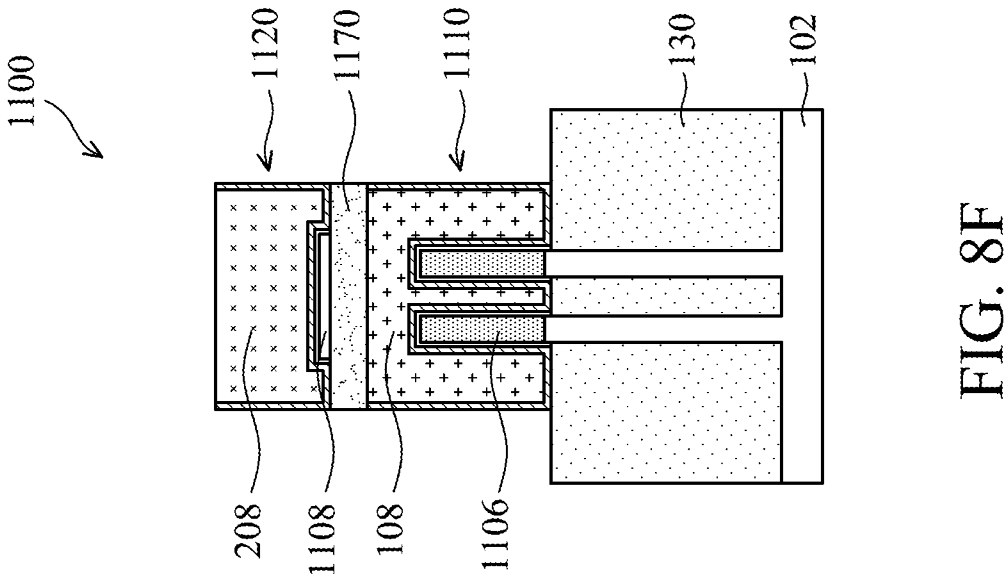
Figure 8E:
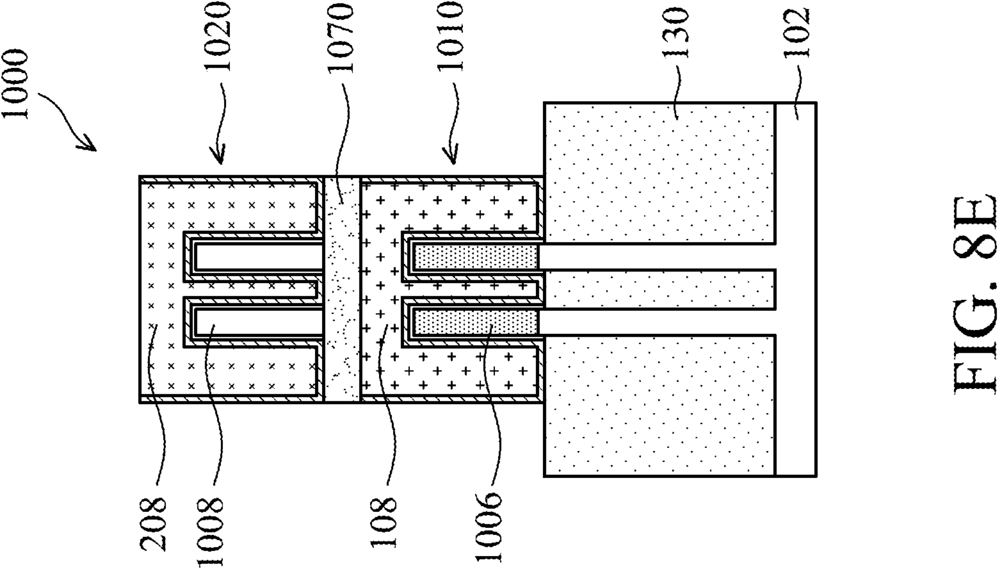

As shown in FIG. 8E, a semiconductor device 1000 may include a first semiconductor device 1010 and a second semiconductor device 1020. The semiconductor device 1000 of FIG. 8E is substantially the same as the semiconductor device 700 of FIG. 8B except that the first semiconductor device 1010 of the semiconductor device 1000 includes semiconductor structures 1006 that are formed of a different semiconductor material than the semiconductor structures 1008 of the second semiconductor device 1020. In some embodiments, the semiconductor structures 1006 are formed of SiGe, while the semiconductor structures 1008 are formed of silicon.

In some embodiments, the semiconductor structures 1006 of the first semiconductor device 1010 have a conductivity type (e.g., P-type) that is different than a conductivity type (e.g., N-type) of the semiconductor structures 1008 of the second semiconductor device 1020.

A bonding layer 1070 is disposed between the first and second semiconductor devices 1010, 1020, which may include one or both the bonding layers 170, 270.

In some embodiments, the semiconductor structures 1006 of the first semiconductor device 1010 may have a crystal lattice structure that is the same as or different as than a crystal lattice structure of the semiconductor structures 1008 of the second semiconductor device 1020.

As shown in FIG. 8F, a semiconductor device 1100 may include a first semiconductor device 1110 that includes one or more FinFET transistors, for example, including semiconductor structures 1106 which are formed as fins generally extending in a vertical direction. The second semiconductor device 1120 may include a planar transistor having a single nanosheet or 2-dimensional (2D) nanostructure 1108. The 2D nanostructure 1108 may be a monolayer or a substantially monolayer of a 2D semiconductor material in some embodiments. In some embodiments, the 2D nanostructure 1108 may be a 2D transition metal dichalcogenide (TMD) material. In some embodiments, the 2D nanostructure 1108 may include one or more of $WS_2$, $WSe_2$, $MoS_2$, $MoSe_2$, $HfS_2$, $HfSe_2$, or any suitable TMD monolayer.

The inclusion of the 2D nanostructure 1108 in the transistor of the second semiconductor device 1120 advantageously provides high carrier mobility and better gate control for short channel effect. In some embodiments, the 2D nanostructure 1108 has a thickness less than 5 nm. In some embodiments, the 2D nanostructure 1108 has a thickness less than 1 nm. In some embodiments, the 2D nanostructure 1108 has a thickness within a range of 0.5 nm to 5 nm.

The first semiconductor device 1110 may be substantially the same as the first semiconductor device 1010 of the semiconductor device 1000 shown in FIG. 8E. However, embodiments are not limited thereto, and in various embodiments, the first semiconductor device 1110 may be any of the semiconductor devices described herein.

A bonding layer 1170 is disposed between the first and second semiconductor devices 1110, 1120, which may include one or both the bonding layers 170, 270.

Each of the semiconductor devices shown in FIGS. 8A through 8F may be formed utilizing any of the methods described herein. For example, the first semiconductor devices of each of the semiconductor devices shown in FIGS. 8A through 8F may correspond with the first semiconductor device 100 of the semiconductor device 300, which may be bonded to a second semiconductor device. The second semiconductor devices of each of the semiconductor devices shown in FIGS. 8A through 8F may correspond with the second semiconductor device 200 of the semiconductor device 300.

Each of the semiconductor devices shown in FIGS. 8A through 8F may be a sequential CFET semiconductor device. In some embodiments, the lower device (first device) may be a PFET device while the upper device (second device) may be a NFET device; however, embodiments are not limited thereto, and in various embodiments, the lower device (first device) may be a NFET device while the upper device (second device) may be a PFET device, which may be implemented in various embodiments herein depending on design considerations, performance considerations, or the like.

In various embodiments, semiconductor devices provided herein include a bonding layer or bonding dielectric disposed between first and second semiconductor devices or structures. In some embodiments, the first and second semiconductor devices have different device architecture or transistor structure from one another, such as nanosheet or gate-all-around transistors, FinFET transistors, 2D structure, or any other type of transistor structure.

In some embodiments, the first and second semiconductor devices have different conductivity types, different semiconductor materials, or different crystal lattice orientations. In some embodiments, source/drain contacts and gate electrodes are provided in two or more layers, which facilitates implementation of the semiconductor device as a sequential CFET device, as the electrical features of a first semiconductor device may be isolated from those of a second semiconductor device.

Embodiments of the present disclosure provide semiconductor devices and methods in which first and second semiconductor devices (e.g., transistors) of a semiconductor device may be stacked on one another and physically or electrically isolated from one another. This facilitates formation of the first and second semiconductor devices having different device architecture or transistor structure from one another, such as nanosheet or gate-all-around transistors, FinFET transistors, 2D structure, or any other type of transistor structure. In some embodiments, the first and second semiconductor devices have different conductivity types, different semiconductor materials, or different crystal lattice orientations. In some embodiments, source/drain contacts and gate electrodes are provided in two or more layers that are separated from one another by the bonding layer, which facilitates implementation of the semiconductor device as a sequential CFET device, as the electrical features of a first semiconductor device may be isolated from those of a second semiconductor device.

In one or more embodiments, a method includes forming a first transistor of a first semiconductor device. The first transistor includes a first channel region and a gate electrode on the first channel region. A second semiconductor device is bonded to the first semiconductor device by a bonding layer disposed between the first and second semiconductor devices. A second transistor of the second semiconductor device is formed that includes a second channel region and a second gate electrode on the second channel region. The bonding layer is disposed between the first gate electrode of the first transistor and the second gate electrode of the second transistor.

In one or more embodiments, a method includes forming a first semiconductor device on or in a first substrate, which includes forming a first channel region and forming a first gate electrode overlying the first channel region. A first source/drain region is formed in contact with the first channel region, with the first source/drain region adjacent to the first channel region along a first direction. A first bonding layer is formed on the first semiconductor device, and a second bonding layer is formed on a second substrate. The first bonding layer and the second bonding layer are bonded to one another. A second semiconductor device is formed on or in the second substrate, which includes forming a second channel region and forming a second gate electrode overlying the second channel region. A second source/drain region is formed in contact with the second channel region, with the second source/drain region adjacent to the second channel region along the first direction.

In one or more embodiments, a device includes a substrate and a first transistor on the substrate. The first transistor includes a first channel region, a first gate electrode overlying the first channel region, and a first source/drain region in contact with the first channel region. The first source/drain region is disposed adjacent to the first channel region along a first direction. An insulating layer is disposed on the first transistor, and a second transistor is disposed on the insulating layer. The second transistor includes a second channel region, a second gate electrode overlying the second channel region, and a second source/drain region in contact with the second channel region. The second source/drain region is disposed adjacent to the second channel region along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first transistor of a first semiconductor device, the forming the first transistor including:
 forming a first channel region; and
 forming a first gate electrode on the first channel region;

forming a first bonding layer on the first semiconductor device;

forming a second bonding layer on a second semiconductor device;

bonding the first bonding layer to the second bonding layer;

forming a second transistor of the second semiconductor device subsequent to bonding the first bonding layer to the second bonding layer, the forming the second transistor including:
 etching the second semiconductor device and etching the second bonding layer forming a recessed region of the second bonding layer and forming a raised region of the second bonding layer;
 forming a high-k gate dielectric layer on and along the recessed region of the second bonding layer and the raised region of the second bonding layer;
 forming a second channel region; and
 forming a second gate electrode on the second channel region, wherein the first bonding layer and the second bonding layer are disposed between the first gate electrode of the first transistor and the second gate electrode of the second transistor.

2. The method of claim 1, wherein forming the first channel region includes forming the first channel region having a first electrical conductivity type, and wherein forming the second channel region includes forming the second channel region having a second electrical conductivity type that is different than the first electrically conductive type.

3. The method of claim 1, wherein forming one of the first transistor or the second transistor includes forming an epitaxial source/drain region by epitaxial growth from one of the first channel region or the second channel region, at least one void being disposed between the first bonding layer and the epitaxial source/drain region.

4. The method of claim 1, wherein forming the second channel region includes forming the second channel region of a different material than the first channel region, and wherein forming the first channel region includes forming a silicon germanium region, and forming the second channel region includes forming a silicon region.

5. The method of claim 1, wherein forming the first bonding layer and forming the second bonding layer includes forming the first bonding layer and the second bonding layer including at least one of: SiO, SiOC, SiOCN, SiN, SION, AlN, BN, SiC, diamond, or BeO.

6. The method of claim 1, wherein forming the first bonding layer and forming the second bonding layer includes forming at least one of the first bonding layer or the second bonding layer having a thickness that is less than 50 nm.

7. The method of claim 1, wherein forming the first channel region includes forming the first channel region having a first lattice plane orientation, and forming the second channel region includes forming the second channel region having a second lattice plane orientation that is different than the first lattice plane orientation.

8. A method, comprising:

forming a first semiconductor device on or in a first substrate, the forming the first semiconductor device including:

forming a first channel region;

forming a first gate electrode overlying the first channel region; and forming a first source/drain region in contact with the first channel region, the first source/drain region adjacent to the first channel region along a first direction;

forming a first bonding layer on the first semiconductor device;

forming a second bonding layer on a second substrate;

bonding the first bonding layer and the second bonding layer to one another; and forming a second semiconductor device on or in the second substrate, the forming the second semiconductor device including:

etching the second semiconductor device and the second bonding layer forming a recessed region within the second bonding layer and forming a raised region of the second bonding layer;

forming a high-k gate dielectric layer on and along the recessed region of the second bonding layer and the raised region of the second bonding layer;

forming a second channel region;

forming a second gate electrode overlying the second channel region; and forming a second source/drain region in contact with the second channel region, the second source/drain region adjacent to the second channel region along the first direction.

9. The method of claim 8, wherein forming the first channel region includes forming the first channel region having a first electrically conductive type, and forming the second channel region includes forming the second channel region having a second electrically conductive type that is different than the first electrically conductive type.

10. The method of claim 8, wherein forming the first channel region and forming the second channel region includes forming the first channel region and the second channel region of different materials.

11. The method of claim 8, wherein forming the first channel region includes forming the first channel region having a first lattice plane orientation, and forming the second channel region includes forming the second channel region having a second lattice plane orientation that is different than the first lattice plane orientation.

12. The method of claim 8, further comprising:

forming an electrically conductive via extending from the first source/drain region to the second source/drain region.

13. A method, comprising:

forming a first transistor of a first semiconductor device, the forming the first transistor including:

forming a first channel region;

forming a first interfacial dielectric layer on the first high-k gate dielectric layer;

forming a first high-k gate dielectric layer on the first interfacial layer;

forming a first gate electrode on the first high0*k* gate dielectric layer;

forming a first bonding layer on the first semiconductor device;

forming a second bonding layer on a second semiconductor device;

coupling the first bonding layer to the second bonding layer to couple the first semiconductor device to the second semiconductor device;

forming a second transistor of the second semiconductor device, the forming the second transistor including:

etching the second semiconductor device and etching the second bonding layer forming a recessed region of the second bonding layer and forming a raised region of the second bonding layer;

forming a second channel region;

forming a second interfacial layer on the second channel region;

forming a second high-k gate dielectric layer on and along the recessed region of the second bonding layer, on and along the raised region of the second bonding layer, and on the second interfacial layer; and forming a second gate electrode on the second high-k gate dielectric layer.

14. The method of claim 13, forming the first bonding layer on the first semiconductor device further includes forming the first bonding layer on a first dielectric layer of the first semiconductor device.

15. The method of claim 14, further comprising forming the first dielectric layer on the first gate electrode.

16. The method of claim 13, further comprising forming a second dielectric layer on the second gate electrode.

17. The method of claim 13, wherein forming the first channel region and forming the second channel region includes forming the first channel region and the second channel region of different materials.

18. The method of claim 13, wherein forming the first channel region includes forming the first channel region having a first electrically conductive type, and forming the second channel region includes forming the second channel region having a second electrically conductive type that is different than the first electrically conductive type.

19. The method of claim 13, wherein forming the first bonding layer and forming the second bonding layer includes forming at least one of the first bonding layer or the second bonding layer having a thickness that is less than 50 nm.

20. The method of claim 13, wherein forming the first channel region includes forming the first channel region having a first lattice plane orientation, and forming the second channel region includes forming the second channel region having a second lattice plane orientation that is different than the first lattice plane orientation.

* * * * *